(12) United States Patent
Hidaka et al.

(10) Patent No.: US 10,650,180 B2
(45) Date of Patent: May 12, 2020

(54) CAPACITOR SIMULATION METHOD AND CAPACITOR NONLINEAR EQUIVALENT CIRCUIT MODEL

(71) Applicant: MURATA MANUFACTURING CO., LTD., Kyoto-fu (JP)

(72) Inventors: Seiji Hidaka, Kyoto-fu (JP); Atsushi Sakuragi, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 439 days.

(21) Appl. No.: 14/934,902

(22) Filed: Nov. 6, 2015

(65) Prior Publication Data

US 2016/0063159 A1 Mar. 3, 2016

Related U.S. Application Data

(63) Continuation of application No. PCT/JP2014/062156, filed on May 2, 2014.

(30) Foreign Application Priority Data

May 14, 2013 (JP) .................... 2013-102541

(51) Int. Cl.
*G06F 30/367* (2020.01)
*G06F 17/10* (2006.01)

(52) U.S. Cl.
CPC ............ *G06F 30/367* (2020.01); *G06F 17/10* (2013.01)

(58) Field of Classification Search
CPC .... G06F 17/5036; G06F 17/10; G06F 30/367; G06F 30/23

(Continued)

(56) References Cited

U.S. PATENT DOCUMENTS

| | | | | |
|---|---|---|---|---|
| 4,730,165 A | * | 3/1988 | Nishino | ............... H03G 7/007 327/306 |
| 5,180,996 A | * | 1/1993 | Shiga | ................. H03B 5/1852 331/117 D |

(Continued)

FOREIGN PATENT DOCUMENTS

| | | |
|---|---|---|
| JP | 2002-259482 A | 9/2002 |
| JP | 2006-163606 A | 6/2006 |

(Continued)

OTHER PUBLICATIONS

Jewell et al. ("Simulation of Capacitor Discharge Magnetisation", IEEE 1990, pp. 1638-1640).*

(Continued)

*Primary Examiner* — Iftekhar A Khan
(74) *Attorney, Agent, or Firm* — Studebaker & Brackett PC

(57) ABSTRACT

A capacitor simulation method and nonlinear equivalent circuit model enabling dynamic simulation of nonlinear characteristics when direct-current voltage is applied with high precesion are easily provided using a simple configuration. An equivalent circuit of a capacitor is represented using a series circuit of passive circuit elements. Characteristic change ratios of the passive circuit elements when a direct-current voltage is applied are expressed as an approximate function on the basis of an actually measured value. A reference voltage is referred to by control current sources connected in parallel to the passive circuit elements. The characteristic change ratios are calculated in accordance with the reference voltage Vref. Difference currents are generated on the basis of the characteristic change ratios and currents flowing when no direct-current voltage is applied, they are caused to flow concurrently with the currents (Continued)

flowing when no direct-current voltage is applied, and thus the nonlinear characteristics are simulated.

18 Claims, 15 Drawing Sheets

(58) Field of Classification Search
USPC .......................................................... 703/2
See application file for complete search history.

(56) References Cited

U.S. PATENT DOCUMENTS

| | | | |
|---|---|---|---|
| 6,519,556 B1* | 2/2003 | Chikamichi | G06F 30/367 703/13 |
| 6,697,749 B2* | 2/2004 | Kamitani | G01R 35/005 702/107 |
| 6,832,182 B1* | 12/2004 | Wilson, Jr. | G06F 30/367 703/13 |
| 7,263,477 B2* | 8/2007 | Chen | G06F 30/367 703/13 |
| 7,383,140 B2* | 6/2008 | Paz | G01R 27/02 702/65 |
| 7,394,647 B2* | 7/2008 | Togashi | H01G 4/012 361/306.1 |
| 8,120,891 B2* | 2/2012 | Takashima | H01G 4/30 361/303 |
| 8,635,037 B2* | 1/2014 | Quet | H01M 8/04656 702/63 |
| 8,650,526 B2* | 2/2014 | Ueno | G06F 30/367 716/132 |
| 8,710,810 B1* | 4/2014 | McJimsey | H02M 3/1584 323/272 |
| 8,718,987 B2* | 5/2014 | Wu | G06F 30/367 703/2 |
| 8,886,507 B2* | 11/2014 | Sharma | G06F 11/26 703/14 |
| 8,972,913 B1* | 3/2015 | Samoylov | G06F 30/367 716/100 |
| 9,355,210 B2* | 5/2016 | Hidaka | G06F 30/367 |
| 9,563,728 B2* | 2/2017 | Sakai | G06F 30/367 |
| 2003/0173979 A1* | 9/2003 | Maeshima | G06F 30/367 324/649 |
| 2003/0182639 A1* | 9/2003 | Lehner | G06F 30/367 716/102 |
| 2003/0188267 A1* | 10/2003 | Lehner | G06F 30/367 716/113 |
| 2005/0267724 A1* | 12/2005 | Niki | G06F 30/367 703/14 |
| 2009/0103243 A1* | 4/2009 | Mizukoshi | H01G 9/012 361/523 |
| 2011/0307235 A1* | 12/2011 | Wu | G06F 30/367 703/14 |
| 2012/0185223 A1* | 7/2012 | Wu | G06F 30/367 703/2 |
| 2013/0239083 A1* | 9/2013 | Ueno | G06F 30/398 716/136 |
| 2014/0012559 A1* | 1/2014 | Sakai | G06F 30/367 703/14 |
| 2014/0244225 A1* | 8/2014 | Balasingam | G01R 31/367 703/2 |
| 2014/0375334 A1* | 12/2014 | Rodriguez | H02J 3/01 324/602 |
| 2015/0012899 A1* | 1/2015 | Hidaka | G06F 30/367 716/107 |

FOREIGN PATENT DOCUMENTS

| | | |
|---|---|---|
| JP | 2008-242548 A | 10/2008 |
| JP | 2010-204869 A | 9/2010 |
| JP | 2015-150579 A | 8/2015 |
| WO | 2012-090602 A1 | 7/2012 |

OTHER PUBLICATIONS

Cadence App. Note("A Nonlinear Capacitor Model for Use in the PSpice Environment", 2009, pp. 1-3).*
John D. Prymak ("Spice Modeling of Capacitors", CARTS—© 1995 Components Technology Institute, Inc, pp. 1-5).*
Zubieta et al. ("Characterization of Double-Layer Capacitors for Power Electronics Applications", IEEE, 2000, pp. 199-205).*
Wikipedia document (Source transformation, pp. 1-2, dated Mar. 12, 2008(original document date from WIKI history).*
John D. Prymak ("SPICE Modeling of Capacitors", Components Technology Institute, Inc. 1995, pp. 1-5) (Year: 1995).*
Zubieta et al. ("Characterization of Double-Layer Capacitors for Power Electronics Applications", IEEE, 2000, pp. 199-205) (Year: 2000).*
Cadence ("A Nonlinear Capacitor Model for Use in the PSpice Environment", Cadence App Note, 2009, pp. 1-4) (Year: 2009).*
International Search Report and Written Opinion of the International Searching Authority, PCT/JP2014/062156, dated Aug. 5, 2014.

* cited by examiner

FIG. 3 (a) FREQUENCY CHARACTERISTICS FOR IMPEDANCE MAGNITUDE (Mag Z)
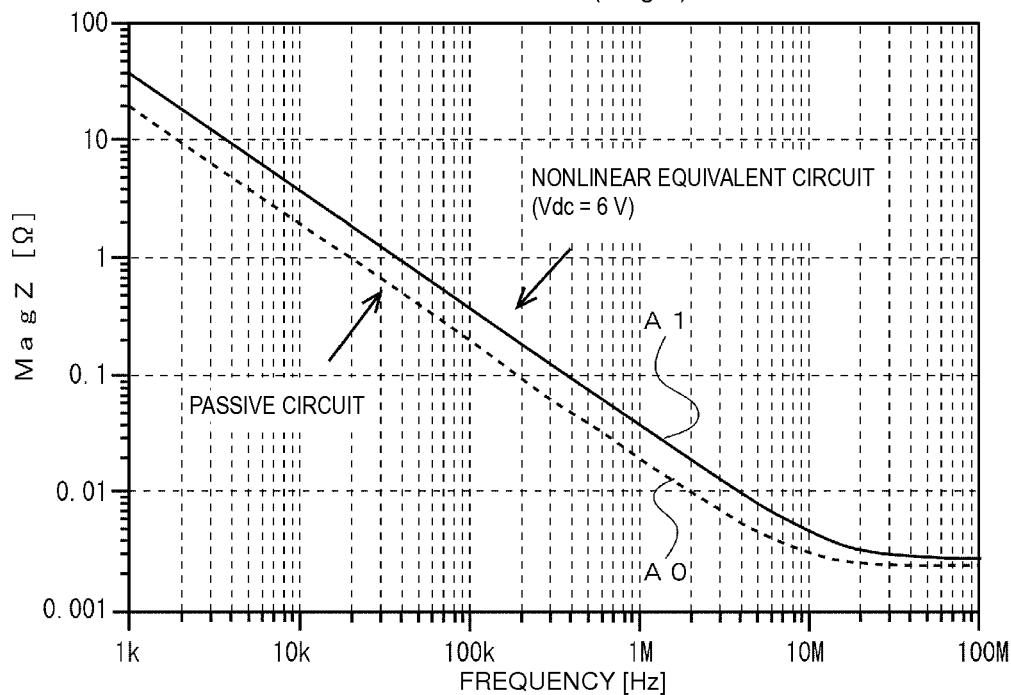
FIG. 3 (b) FREQUENCY CHARACTERISTICS FOR EQUIVALENT SERIES RESISTANCE (ESR)
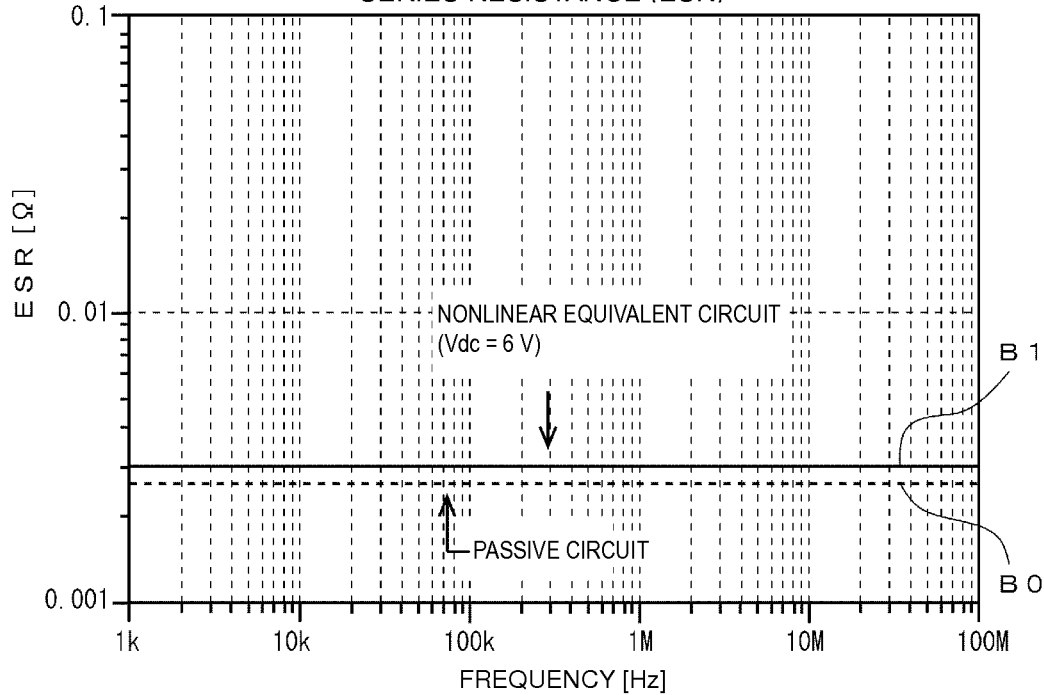

EQUIVALENT

| PASSIVE CIRCUIT MODEL | NONLINEAR MODEL |
|---|---|
    |
    |
    |

PASSIVE CIRCUIT MODEL

NONLINEAR MODEL

CAPACITOR SIMULATION METHOD AND CAPACITOR NONLINEAR EQUIVALENT CIRCUIT MODEL

CROSS REFERENCE TO RELATED APPLICATIONS

This application claims benefit of priority to International Patent Application No. PCT/JP2014/062156 filed May 2, 2014 and JP 2013-102541 filed May 14, 2013, the entire content of each of which is incorporated herein by reference.

TECHNICAL FIELD

The present disclosure relates to a capacitor simulation method of simulating nonlinear characteristics of capacitors when direct-current voltage is applied and a capacitor nonlinear equivalent circuit model for use in the simulation.

BACKGROUND ART

Simulation methods and equivalent circuit models for electronic components of this kind are used in circuit simulations in electronic circuit design. The circuit simulations employ circuit simulators, such as a simulation program with integrated circuit emphasis (SPICE). Some circuit simulators can be used at websites of producers of electronic components. A user can access a website of a producer of electronic components from a terminal, such as a personal computer, over the Internet network and use the circuit simulator.

One example of the simulation methods and equivalent circuit models of this type is the one for capacitors disclosed in Japanese Unexamined Patent Application Publication No. 2002-259482.

In this simulation, as illustrated in FIG. 1 in Japanese Unexamined Patent Application Publication No. 2002-259482, given capacitor frequency characteristics of a capacitor are input in a first step, one of an RC circuit, RL circuit, and RCL circuit is formed as an equivalent circuit model representing a circuit enabling simulation in a time domain using frequency-independent resistances (R), capacitances (C), and/or inductances (L) in a second step, an evaluation function for evaluating accuracy of the equivalent circuit model formed in the second step is composed in a third step, and the evaluation function composed in the third step is minimized and thus a circuit constant is determined in a fourth step.

In Japanese Unexamined Patent Application Publication No. 2002-259482, with the above-described configuration, the equivalent circuit model enabling simulation in a time domain for a capacitor with an impedance indicated in a frequency domain is derived, and the electric characteristics of the capacitor in the frequency domain or time domain are estimated by circuit simulation.

One example of known inductor simulation methods and equivalent circuit models is disclosed in Japanese Unexamined Patent Application Publication No. 2010-204869.

As illustrated in FIG. 1(C) in Japanese Unexamined Patent Application Publication No. 2010-204869, this simulation uses an equivalent circuit model in which a series circuit of an inductance L1 and a resistance R1 for skin effect of an internal conductor is connected in parallel to a mutual inductance Lm between a direct-current inductance L0 and the inductance L1 and that parallel circuit is connected in series to the direct-current inductance L0 and a direct-current resistance Rdc1 of the internal conductor. In this equivalent circuit model, an inductance and a resistance of an outer electrode are considered at the same time, the inductance L0 is connected in series to an inductance Ls of the outer electrode, and the direct-current resistance Rdc1 of the inner conductor is connected in series to a direct-current resistance Rdc2 of the outer electrode. A series circuit of a parasitic capacitance Cp of a dielectric constituting a chip in a multilayer chip inductor and a resistance Rp representing a dielectric loss is connected in parallel to the inner sides of the equivalent elements Ls and Rdc2 of the outer electrode.

In Japanese Unexamined Patent Application Publication No. 2010-204869, errors occurring between circuit performance in circuit design and a real one are suppressed by circuit simulation using the above-described equivalent circuit model.

One example of known capacitor simulation methods and equivalent circuit models is a technique disclosed in Japanese Unexamined Patent Application Publication No. 2012-150579. This technique employs an idealized C circuit model and a wide-band high-precision equivalent circuit model.

As illustrated in FIG. 1(A) in Japanese Unexamined Patent Application Publication No. 2012-150579, the idealized C circuit model is represented by an equivalent circuit including a single capacitive element C is a circuit element. A voltage v applied across the capacitive element C is expressed by the following expression (1).

$$v = v_{ac} + V_{dc} \quad (1)$$

where $v_{ac}$ denotes a time-varying signal voltage and a noise voltage and $V_{dc}$ denotes DC bias voltage applied across the capacitive element C.

The characteristics in which the capacitive element C is changed by the DC bias voltage $V_{cc}$ are expressed by the following polynomial expression (2).

$$\begin{aligned} C &= C(V_{dc}) \\ &= C_0 + C_1 V_{dc} + C_2 V_{dc}^2 + C_3 V_{dc}^3 + C_4 V_{dc}^4 + \\ &\quad C_5 V_{dc}^5 + C_6 V_{dc}^6 + \ldots \end{aligned} \quad (2)$$

A current i flowing through the capacitive element C is expressed by the following expression (3).

$$i = C(V_{dc}) \cdot dv/dt \quad (3)$$

To calculate Expression (3), as illustrated in FIG. 1(B) in Japanese Unexamined Patent Application Publication No. 2012-150579, an operation circuit is established. In this operation circuit, the capacitive element C is converted into a nonlinear voltage control voltage source UA3 controlled by the DC bias voltage $V_{dc}$. The total voltage v applied across the capacitor passes through low pass filters L1 and R1 each having a significantly low cutoff frequency via a linear voltage control voltage source E1, the DC bias voltage $V_{dc}$ is thus obtained, and it is provided to the nonlinear voltage control voltage source UA3. The total voltage v is supplied to the input terminal of a differentiator UA1 via a linear voltage control voltage source E2, and thus differentiation dv/dt is performed. An output voltage v1 of the differentiator UA1 is input into a three-terminal multiplier UA2, together with an output voltage ($C(V_{dc})$) of the nonlinear voltage control voltage source UA3, which is a substitute for the capacitive element C, and thus multiplication ($C(V_{dc}) \cdot dv/dt$) is performed. In this manner, a result of the multiplication is output to an output terminal of the multiplier UA2. Because an output voltage v2 of the multiplier UA2 is equal to the product of the current i flowing through the capacitor and a unit resistance, it is replaced with the capacitor using a linear voltage control current source G controlled by the output voltage v2.

Such an idealized C circuit model is not suited for circuit simulation because a difference from the impedance characteristics of an actual component, in particular, different in a high-frequency band is too large, but it is useful for an early stage in circuit design or prediction of circuit characteristics.

The wide-band high-precision equivalent circuit model disclosed in Japanese Unexamined Patent Application Publication No. 2012-150579 is applied to a simulation of a multilayer ceramic capacitor (MLCC). This simulation uses the equivalent circuit model having the circuit configuration illustrated in FIG. 5(A) in Japanese Unexamined Patent Application Publication No. 2012-150579. As illustrated in FIG. 5(B) in Japanese Unexamined Patent Application Publication No. 2012-150579, in a multilayer chip capacitor 10, a plurality of internal electrodes 20 are stacked, and electrodes are extended out therefrom in opposite directions in an alternating manner. The equivalent circuit illustrated in FIG. 5(A) in Japanese Unexamined Patent Application Publication No. 2012-150579 takes the thickness of each of the plurality of internal electrodes 20 of the multilayer chip capacitor 10 into consideration. In addition to the electromagnetic effect in an upper surface 22 and a lower surface 24 in each of the plurality of internal electrodes 20, the electromagnetic effect in a first side surface 26 and a second side surface 28 and an open end surface 30 of the plurality of internal electrodes 20 are considered.

All values of various circuit elements in this equivalent circuit are changed by a DC bias voltage. The changes in characteristics of each of the circuit elements caused by the DC bias voltage are expressed by a polynomial expression, and the equivalent circuit model of the MLCC when these changes in characteristics are considered is illustrated in FIG. 12. This model employs a differentiator, multiplier, three-terminal and four-terminal adders and also uses a divider and five-terminal adder. Such a wide-band high-precision model that considers the changes in characteristics caused by the DC bias voltage can achieve good simulation precision in a wide frequency band.

SUMMARY OF DISCLOSURE

Technical Problem

Characteristic values of electronic components, for example, electrostatic capacities of capacitors or inductances of inductors, change with applied superimposed DC bias voltages or direct currents, and the changes are not negligible in circuit simulation. However, each of the equivalent circuit models used in the known simulation methods for electronic components disclosed in Japanese Unexamined Patent Application Publication No. 2002-259482 and Japanese Unexamined Patent Application Publication No. 2010-204869 is made of a combination of only passive circuit elements of a resistive element R, inductive element L, and capacitive element C, and do not reflect changes in characteristics occurring in the electronic component when the superimposed DC bias voltage or direct current is applied.

In the known simulation method for an electronic component disposed in Japanese Unexamined Patent Application Publication No. 2012-150579, the use of a voltage source model or current source model in the equivalent circuit model enables the changes in characteristics occurring in the electronic component when the superimposed DC bias voltage is applied to be reflected in simulation. However, this equivalent circuit model has a complex configuration including operation circuits for differentiation, multiplication, addition, and the like. Thus the equivalent circuit model cannot be derived regularly under a certain rule, and the action of driving the equivalent circuit model is very difficult. Because of this complex configuration, it is also difficult to estimate circuit operations, and the circuit is not transparent. In addition, because the approximate expression reflecting the dependence of the direct-current bias includes terms with odd number exponents, as indicated in Expression (2), cases where the direct-current bias has an inversed sign are not supported, and the model has a polarity problem. If the value of the direct-current bias changes suddenly, a problem arises in that the value is converted into a divergent value.

Solution to Problem

The present disclosure is made to solve the above problems, and provides a capacitor simulation method of simulating nonlinear characteristics of a capacitor when direct-current voltage is applied. The capacitor simulation method includes:

representing an equivalent circuit of the capacitor by using a passive circuit element;

expressing characteristic change ratio of the passive circuit element under a direct-current voltage as an approximate function using the voltage as a variable, based on actually measured values; and referring to the voltage across the capacitor, generating, based on the characteristic change ratio calculated using the approximate function in accordance with the referred voltage and on a current flowing in the passive circuit element under no direct-current voltage and by using a control current source connected in parallel to the passive circuit element whose characteristics are changed by application of the direct current, a difference current between a current flowing in the passive circuit element under the direct-current voltage and the current under no direct-current voltage, and causing the difference current to flow concurrently with the current under no direct-current voltage, whereby the nonlinear characteristics of the capacitor under a direct current voltage is simulated.

The present disclosure also provides a capacitor nonlinear equivalent circuit model. The capacitor nonlinear equivalent circuit model includes:

a passive circuit element that represents an equivalent circuit of a capacitor;

voltage referring device configured to refer to a voltage across the capacitor; and a control current source connected in parallel to the passive circuit element whose characteristics are changed by application of a direct-current voltage, the control current source being configured to generate, based on a characteristic change ratio calculated in accordance with the voltage referred to by the voltage referring device and by using an approximate function which expresses, using a voltage as a variable, a characteristic change ratio of the passive circuit element under a direct-current voltage and which is obtained based on actually measured values, and based on a current under no direct current voltage which flows through the passive circuit element when no direct current voltage is applied, a difference current between a current flowing in the passive circuit element under the direct-current voltage and the current under no direct-current voltage.

In the capacitor simulation method and capacitor nonlinear equivalent circuit model in the present configuration, the characteristic change ratio of the passive circuit element when the direct-current voltage is applied is expressed as the approximate function using the referred voltage as the variable, based on the actually measured value. Accordingly, the characteristic change ratio of the passive circuit element is calculated from the approximate function in accordance with the referred voltage. The current flowing in the passive circuit element when the direct-current voltage is applied can be determined by causing the difference current, between the current flowing under application of the direct-current voltage and the current flowing under no direct-current voltage applied, to flow concurrently with the current flowing under no direct-current voltage. Thus the difference current between the current flowing under application of the direct-current voltage and the current flowing under no direct-current voltage applied is generated by the control current source, based on the above-mentioned characteristic change ratio and the current under no direct current voltage applied, and the passive circuit element is connected in parallel to the control current source to cause the difference current to flow concurrently with the current flowing under no direct-current voltage, thus enabling simulation of the current flowing under application of the direct-current voltage in the passive circuit element.

More specifically, the characteristic change ratio of the passive circuit element is calculated using the approximate function in accordance with the voltage applied to the capacitor, and the difference current is generated by the control current source, based on the characteristic change ratio and the current flowing under no direct-current voltage applied, thus implementing the simulation capable of performing dynamic tracking for any applied direct-current voltage. It is thus possible to provide, with a simple configuration and without difficulty, a capacitor simulation method and capacitor nonlinear equivalent circuit model capable of precisely and dynamically simulating nonlinear characteristics of the capacitor under application of a direct-current voltage. The capacitor nonlinear equivalent circuit model can be obtained by using as a reference the current flowing under no direct current voltage applied, specifically by simply causing the difference current to flow concurrently with the current flowing under no direct-current voltage applied by the control current source, as described above. Thus, conversely, by removing the control current source from the equivalent circuit model, the capacitor equivalent circuit model corresponding to the current flowing under no direct-current voltage applied, that is, in the case where no direct-current voltage is applied, can be easily obtained.

In the present disclosure, the difference current may be given as a function form of the following expression:

$$\Delta I = I_0 \times [\exp(f(x)) - 1]$$

where the difference current is $\Delta I$, the current flowing when no direct-current voltage is applied is $I_0$, and the approximate function is the function $\exp(f(x))$ using the referred voltage x as a variable.

With this configuration, when the value of the referred voltage x is zero, the value of the function $\exp(f(x))$, which is an exponential function, is one, the value of the coefficient $[\exp(f(x))-1]$, which is multiplied to the current $I_0$ flowing when no direct-current voltage is applied, is zero, and the value of the difference current $\Delta I$ is also zero. When the value of the referred voltage x is not zero, the value of the function $\exp(f(x))$ is larger than one, and the value of the coefficient $[\exp(f(x))-1]$, which is multiplied to the current $I_0$ flowing when no direct-current voltage is applied, is larger than zero. Thus, the value of the difference current $\Delta I$ is calculated so as to correspond to the state of actual use. When the value of the referred voltage x is not zero, the difference current $\Delta I$ is calculated in accordance with the voltage x on all occasions, whereby the characteristics of the capacitor are simulated, and the results are utilized for qualitative understanding of the capacitor.

In the present disclosure, the approximate function may be given by an even function in a polynomial form that includes no odd number exponents.

With this configuration, because the approximate function is expressed as the polynominal form including no odd number exponents, the characteristic change ratio in the passive circuit element can be appropriately approximated by the approximate function even when the sign of the direct-current bias is inversed or even when the value of the direct-current bias changes suddenly, unlike known capacitor simulations.

In the present disclosure, the voltage across the capacitor may be referred to at both terminals of the equivalent circuit, and the current flowing under no direct-current voltage applied may be referred to at an input terminal or an output terminal of the passive circuit element.

With this configuration, unlike a method of performing calculation by setting the reference voltage or the current flowing under no direct-current voltage separately from the equivalent circuit model, the calculation of the difference current is performed by making reference to an instantaneous voltage occurring across the circuit in the equivalent circuit model or an instantaneous current occurring at the input terminal or output terminal of the passive circuit element in the equivalent circuit model. Thus, the voltage and the current flowing under no direct-current voltage applied which are to be relied upon in the calculation of the difference current can be referred to without time lags, and transient response analysis for nonlinearity of the capacitor can be made at high speed and with high precision.

In the present disclosure, the passive circuit element connected in parallel to the control current source may be a single capacitive element, or a parallel circuit of a capacitive element and a resistive element, or a parallel circuit of a capacitive element, a resistive element, and an inductive element.

With this configuration, the characteristics of the passive circuit element when no direct-current voltage is applied are represented by the single capacitive element, or the parallel circuit of the capacitive element and the resistive element, or the parallel circuit of the capacitive element, the resistive element, and the inductive element. By connecting the control current source in parallel to the circuit, the characteristics of the passive circuit element when the direct-current voltage is applied are simulated.

In the present disclosure, the control current source and the passive circuit element may constitute a parallel circuit, and a plurality of parallel circuits may be connected in series.

With this configuration, the simple parallel circuits each having the control current source and the passive circuit element are connected in series, and an increased number of connections in series can enhance the accuracy of simulation of the equivalent circuit model. Thus, the equivalent circuit model with high accuracy of simulation can be configured in a regular and transparent manner. Because the plurality of parallel circuits of the control current sources and the passive circuit elements are simply connected in series, the characteristics of the passive circuit element under a direct-current voltage can be simulated by a systematic calculation procedure.

In the present disclosure, the equivalent circuit may include a passive circuit element whose characteristics are not changed by application of a direct-current voltage to the capacitor.

With this configuration, because the equivalent circuit model includes combination of the passive circuit elements whose characteristics are changed by the application of a direct-current voltage and the passive circuit elements whose characteristics are not changed by the application of the direct-current voltage, the precision of the simulation of the nonlinear characteristics of the capacitor can be further enhanced, and the frequency band of the simulation can be widened.

The present disclosure provides a computer program for executing any one of the capacitor simulation methods described above or for causing any one of the capacitor nonlinear equivalent circuit models described above. The computer program includes:

a first step of inputting a type of the capacitor;

a second step of inputting a voltage to be applied to the capacitor or a current to be flowed to the capacitor; and a third step of making reference to the voltage across the capacitor in accordance with the voltage or the current input in the second step, generating the difference current by the control current source based on the characteristic change ratio calculated using the approximate function prepared in advance for the capacitor of the type input in the first step in accordance with the referred voltage and the current flowing under no direct-current voltage applied, causing the difference current to flow concurrently with the current flowing under no direct-current voltage, thereby simulating the nonlinear characteristics of the capacitor when the direct-current voltage is applied.

With this configuration, inputting the type of the capacitor to be simulated and the value of the voltage to be applied to the capacitor or the current to be flowed to the capacitor into the computer program enables the computer program to cause the difference current to flow concurrently with the current flowing under no direct-current voltage applied of the passive circuit element and to automatically perform simulation of the nonlinear characteristics of the capacitor of the type input. Thus, a user of this simulation method or nonlinear equivalent circuit model can perform accurate circuit simulation with high precision easily by simply inputting the type of the capacitor to be simulated and the voltage to be applied to the capacitor or the current to be flowed to the capacitor into the computer program. As a result, even an ordinary user who does not have expert knowledge of circuit simulation can easily perform accurate circuit simulation for electronic circuits using the capacitor with high precision.

The present disclosure provides a method of using the computer program by accessing a server having the computer program over the Internet network and using the computer program from a terminal connected to the Internet network.

With this configuration, a user can readily use the above-described computer program by accessing a server having the above-described computer program from a terminal connected to the Internet network. Thus, the capacitor simulation method and capacitor nonlinear equivalent circuit model according to the present disclosure can be provided to many users.

Advantageous Effects of Disclosure

According to the present disclosure, as described above, the capacitor simulation method and nonlinear equivalent circuit model enabling dynamic simulation of nonlinear characteristics of the capacitor when direct-current voltage is applied with high precesion can be easily provided using a simple configuration.

BRIEF DESCRIPTION OF DRAWINGS

FIG. 3(a) is a graph that represents frequency characteristics for magnitude MagZ of capacitor impedance Z calculated from the nonlinear equivalent circuit model illustrated in FIG. 1(b) in comparison with characteristics calculated from the passive equivalent circuit model illustrated in FIG. 1(a) and FIG. 3(b) is a graph that represents frequency characteristics for capacitor equivalent series resistance ESR calculated from the nonlinear equivalent circuit model illustrated in FIG. 1(b) in comparison with characteristics calculated from the passive equivalent circuit model illustrated in FIG. 1(a).

DESCRIPTION OF EMBODIMENTS

Embodiments applied to LTspice supplied from Linear Technology Corporation of a capacitor simulation method and capacitor nonlinear equivalent circuit model according to the present disclosure are described below.

Figure 1:
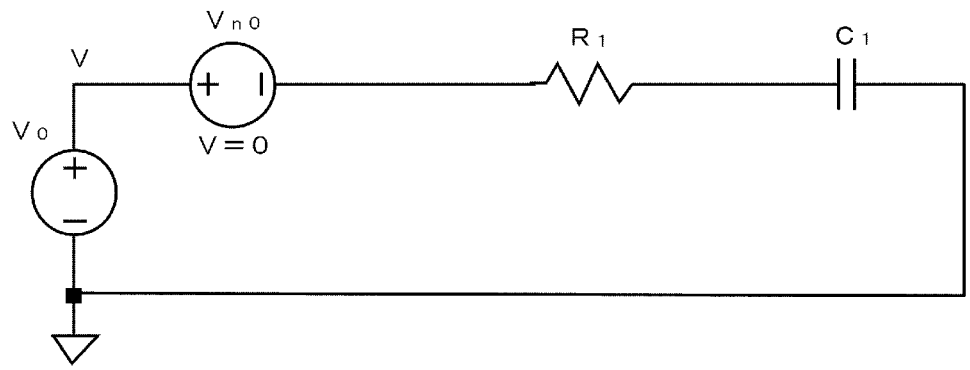
FIG. 1(a) is a circuit diagram that illustrates a capacitor passive equivalent circuit model when no direct-current voltage is applied in a first embodiment of the present disclosure and FIG. 1(b) is a circuit diagram that illustrates a capacitor nonlinear equivalent circuit model when direct-current voltage is applied in the first embodiment.
Figure 1:
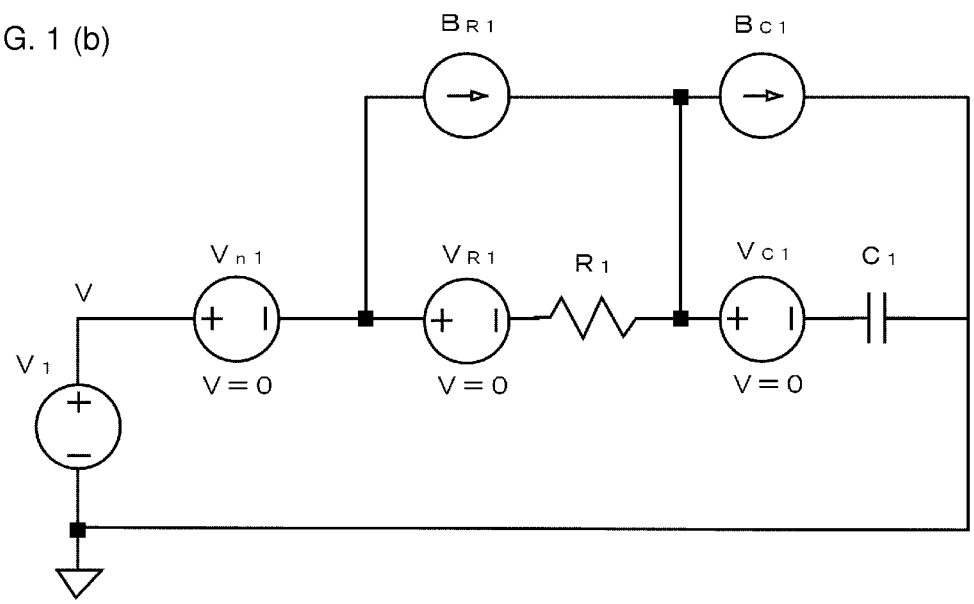

FIG. 1(a) is a circuit diagram that illustrates a capacitor passive equivalent circuit model when no direct-current voltage is applied in a first embodiment. FIG. 1(b) is a circuit diagram that illustrates a capacitor nonlinear equivalent circuit model when direct-current voltage is applied in the first embodiment.

A series circuit of a resistive element R1 and a capacitive element $C_1$ in each equivalent circuit model constitutes a passive circuit element representing an equivalent circuit of the capacitor being a target for simulation. In the passive equivalent circuit model illustrated in FIG. 1(a), an alternating-current voltage Vac in which no direct-current voltage Vdc is superimposed is applied to the passive circuit elements $R_1$ and $C_1$ as a voltage V by a voltage source model $V_0$ of LTspice. In the nonlinear equivalent circuit model illustrated in FIG. 1(b), an alternating-current voltage Vac in which direct-current voltage Vdc is superimposed is applied to passive circuit elements L1 and R1 as the voltage V by a voltage source model V1. Here, the circuit constant of the capacitive element $C_1$ in each equivalent circuit is set to 8 μF, the circuit constant of the resistive element $R_1$ is set to 2.5 mΩ, and the applied direct-current voltage Vdc is set to 6 V.

A voltage source model $V_{n0}$ in the passive equivalent circuit model illustrated in FIG. 1(a) and voltage source models $V_{n1}$, $V_{R1}$, and $V_{C1}$ illustrated in the nonlinear equivalent circuit model illustrated in FIG. 1(b) measure the current I flowing in locations in the equivalent circuit models. These voltage source models $V_{n0}$, $V_{n1}$, $V_{R1}$, and $V_{C1}$ are components that are set for the sake of convenience in LTspice to measure currents at locations, have their setting voltage V of 0 V, and are used as a substitute for an ammeter.

Control current sources $B_{R1}$ and $B_{c1}$ illustrated in FIG. 1(b) generate difference currents $\Delta I_{R1}$ and $\Delta I_{C1}$ between currents $I_{R1}(Vdc)$ and $I_{C1}(Vdc)$ when direct-current voltage is applied and currents $I_{R1}$ and $I_{C1}$ flowing when no direct-current voltage is applied, on the basis of the ratio of change of a circuit constant of each of the passive circuit elements $R_1$ and $C_1$, that is, characteristic change ratios $k_{R1}(Vdc)$ and $k_{C1}(Vdc)$ and currents $I_{R1}$ and $I_{C1}$ flowing when no direct-current voltage is applied, as described below. The currents $I_{R1}$ and $I_{C1}$ flowing when no direct-current voltage is applied are referred to at the input terminals of the passive circuit elements $R_1$ and $C_1$ by the voltage source models $V_{R1}$ and $V_{C1}$, and they may be referred to at the output terminals of the passive circuit elements $R_1$ and $C_1$. Here, the characteristic change ratios $k_{R1}(Vdc)$ and $k_{C1}(Vdc)$ are ratios of the circuit constants of the passive circuit elements $R_1$ and $C_1$ when the direct-current voltage Vdc is applied to the circuit constants thereof when no direct-current voltage is applied. The currents $I_{R1}$ and $I_{C1}$ flowing when no direct-current voltage is applied are currents flowing through the passive circuit elements $R_1$ and $C_1$ when the direct-current voltage Vdc is not applied. The currents $I_{R1}(Vdc)$ and $I_{C1}(Vdc)$ when direct-current voltage is applied are currents flowing through the passive circuit elements $R_1$ and $C_1$ when the direct-current voltage Vdc is applied. These control voltage sources $B_{R1}$ and $B_{c1}$ are connected in parallel to the passive circuit elements $R_1$ and $C_1$, which change their characteristics by the application of the direct-current voltage Vdc, as illustrated in the drawing.

The passive circuit elements $R_1$ and $C_1$ in each equivalent circuit model indicate the ones having invariant circuit constants independent of the applied direct-current voltage Vdc. Voltage changes in the passive circuit elements $R_1$ and $C_1$ caused by changes in characteristics are represented by the control current sources $B_{R1}$ and $B_{c1}$. The control current sources $B_{R1}$ and $B_{c1}$ are components in LTspice handled as behavior current source models, and their values are determined dependently on a voltage Vref referred to and the currents $I_{R1}$ and $I_{C1}$ flowing when no direct-current voltage is applied. In the present embodiment, the voltage V applied across the capacitor by the voltage source model $V_0$ and $V_1$ are referred to by the control current sources $B_{R1}$ and $B_{c1}$, and the direct-current voltage Vdc of the voltage V is defined as the reference voltage Vref. The control current sources $B_{R1}$ and $B_{c1}$ constitute voltage referring means configured to refer to the voltage Vref applied to the capacitor being a target for simulation. In the present embodiment, of the voltage V, only the direct-current voltage Vdc is referred to. Both of the direct-current voltage Vdc and alternating-current voltage Vac may also be referred to and may be defined as the reference voltage Vref.

Figure 2:
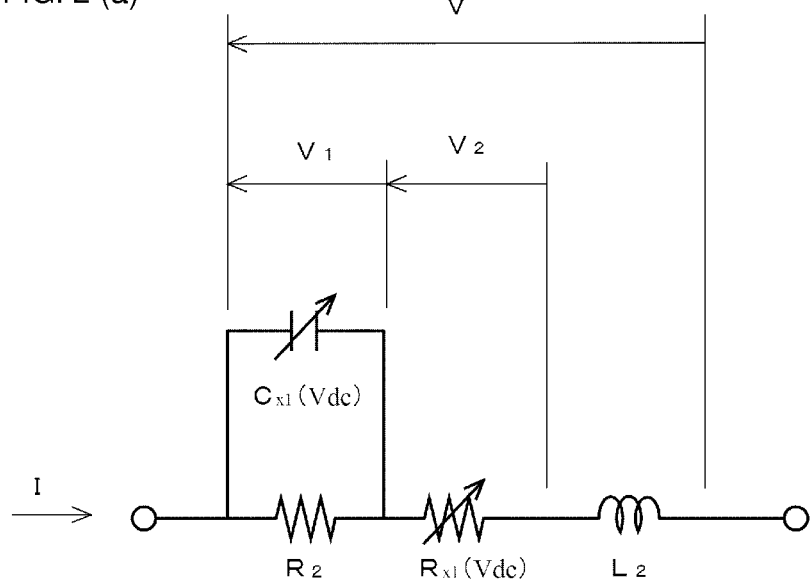
FIG. 2(a) is a circuit diagram that illustrates a capacitor nonlinear equivalent circuit model when direct-current voltage is applied using a variable resistive element $R_{X1}(Vdc)$ and a variable capacitive element $C_{X1}(Vdc)$ and FIG. 2(b) is a circuit diagram that illustrates a capacitor nonlinear equivalent circuit model when direct-current voltage is applied and that is depicted by transforming the variable resistive element $R_{X1}(Vdc)$ and variable capacitive element $C_{X1}(Vdc)$ into an equivalent model in the first embodiment.
Figure 2:
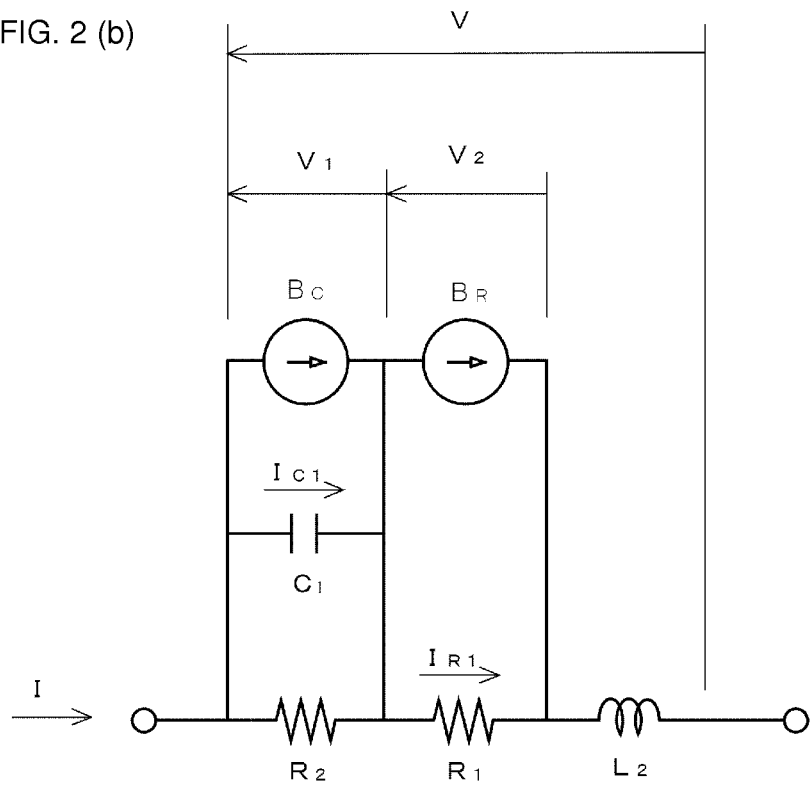

When the circuit constants of the capacitive element $C_1$ and the resistive element $R_1$ are changed by the application of the direct-current voltage Vdc, originally, as illustrated in the circuit diagram of FIG. 2(a), the capacitive element $C_1$ is expressed as a variable capacitive element $C_{x1}$(Vdc) whose capacitance value varies dependently on the value of the applied direct-current voltage Vdc and the resistive element R1 is expressed as a variable resistive element $R_{x1}$(Vdc) whose resistance value varies dependently on the value of the applied direct-current voltage Vdc. The capacitive element $C_1$ is connected in parallel to a resistive element $R_2$. The variable resistive element $R_{x1}$(Vdc) is connected in series to an inductive element $L_2$. The resistive element $R_2$ and inductive element $L_2$ have circuit constants that are not changed by the application of the direct-current voltage Vdc and that are invariant. Thus the symbols of the resistive element $R_2$ and inductive element $L_2$ in the circuit diagrams have no arrows indicating variability, unlike the variable capacitive element $C_{x1}$(Vdc) and variable resistive element $R_{x1}$(Vdc).

It is assumed that the direct current I flows in the input terminal in this circuit, a voltage V1 occurs in a parallel circuit of the variable capacitive element $C_{x1}$(Vdc) and the resistive element $R_2$, and a voltage V2 occurs in the variable resistive element $R_{x1}$(Vdc), as illustrated in the drawings. In this case, the voltage V occurring between the input and output terminals of the circuit and the current I flowing in the circuit are expressed by the following expression (4) and expressions (5) and (6), respectively.

$$V=V_1+V_2 \tag{4}$$

$$I=V_1/R_2+C_{X1}(Vdc)\cdot dV_1/dt \tag{5}$$

$$I=V_2/R_{X1}(Vdc) \tag{6}$$

In the present embodiment, the variable capacitive element $C_{X1}$(Vdc), whose circuit constant is changed by the application of the direct-current voltage Vdc, is expressed as the parallel circuit of the capacitive element $C_1$ and the control current source $B_C$ handled as a behavior current source model in LTspice, as illustrated in FIG. 2(b). The variable resistive element $R_{X1}$(Vdc), whose circuit constant is changed by the application of the direct-current voltage Vdc, is expressed as the parallel circuit of the resistive element $R_1$ and the control current source $B_R$ handled as a behavior current source model in LTspice, as illustrated in FIG. 2(b). The capacitive element $C_1$ and resistive element $R_1$ are the same as those illustrated in FIG. 1 and indicate the ones having invariable circuit constants independent of the applied direct-current voltage Vdc.

The control current source $B_C$ generates a current variation in the capacitive element $C_1$ caused by the application of the direct-current voltage Vdc as a difference current $\Delta I_{C1}$(Vdc) in accordance with the value of the applied direct-current voltage Vdc. The control current source $B_R$ generates a current variation in the resistive element $R_1$ caused by the application of the direct-current voltage Vdc as a difference current $\Delta I_{R1}$(Vdc) in accordance with the value of the applied direct-current voltage Vdc.

By transforming the variable capacitive element $C_{X1}$(Vdc) and the variable resistive element $R_{X1}$(Vdc) in an equivalent model as described above, the original circuit illustrated in FIG. 2(a) is replaced with the nonlinear equivalent circuit model in the present embodiment illustrated in FIG. 2(b). That is, the series circuit of the variable capacitive element $C_{X1}$(Vdc) and the variable resistive element $R_{X1}$(Vdc) illustrated in FIG. 2(a) is replaced with the circuit in which the parallel circuit of the control current source $B_C$ and the capacitive element $C_1$ is connected in series to the parallel circuit of the control current source $B_R$ and the resistive element $R_1$, as illustrated in FIG. 2(b).

In this case, the current I flowing in the nonlinear equivalent circuit model is expressed by the following expressions (7) and (8) using the difference currents $\Delta I_{C1}$(Vdc) and $\Delta I_{R1}$(Vdc) generated by the control current sources $B_C$ and $B_R$.

$$I=V_1/R_2+C_1\cdot dV_1/dt+\Delta I_{C1}(Vdc) \tag{7}$$

$$I=V2/R_1+\Delta I_{R1}(Vdc) \tag{8}$$

The difference current $\Delta I_{C1}$(Vdc) is the difference between the current $I_{C1}$(Vdc) when direct-current voltage is applied and the current $I_{c1}$ flowing when no direct-current voltage is applied in the capacitive element $C_1$ and thus is expressed by the following expression (9) using the characteristic change ratio $k_{C1}$(Vdc) of the capacitive element $C_1$.

$$\begin{aligned}\Delta I_{C1}(Vdc) &= I_{C1}(Vdc) - I_{C1} \\ &= (C_{x1}(Vdc) - C_1)\cdot dV_1/dt \\ &= (k_{C1}(Vdc) - 1)\cdot C_1\cdot dV_1/dt \\ &= (k_{C1}(Vdc) - 1)\cdot I_{C1}\end{aligned} \tag{9}$$

Here, the characteristic change ratio $k_{C1}$(Vdc) is the ratio of the circuit constant $C_{X1}$(Vdc) when the direct-current voltage Vdc is applied to the circuit constant $C_1$ of the passive circuit element $C_1$ when the direct-current voltage Vdc is not applied and is expressed by the following expression (10).

$$k_{C1}(Vdc)=C_{x1}(Vdc)/C_1 \tag{10}$$

The control current source $B_C$ generates the difference current $\Delta I_{C1}$(Vdc) between the current $I_{C1}$(Vdc) when direct-current voltage is applied and the current $I_{c1}$ flowing when no direct-current voltage is applied by multiplying the value in which one is subtracted from the characteristic change ratio $k_{C1}$(Vdc) by the current $I_{c1}$ flowing when no direct-current voltage is applied, as indicated by the following expression (9), that is, on the basis of the characteristic change ratio $k_{C1}$(Vdc) and the current $I_{c1}$ flowing when no direct-current voltage is applied.

The difference current $\Delta I_{R1}$(Vdc) is the difference between the current $I_{R1}$(Vdc) when direct-current voltage is applied and the current $I_{R1}$ flowing when no direct-current voltage is applied in the resistive element R1 and thus is expressed by the following expression (11) using the characteristic change ratio $k_{R1}(Vdc)$ of the resistive element R1.

$$\Delta I_{R1}(Vdc) = I_{R1}(Vdc) - I_{R1} \qquad (11)$$
$$= (1/R_{x1}(Vdc) - 1/R_1) \cdot V_2$$
$$= (1/k_{R1}(Vdc) - 1) \cdot V_2/R_1$$
$$= (1/k_{R1}(Vdc) - 1) \cdot I_{R1}$$

Here, the characteristic change ratio $k_{R1}(Vdc)$ is the ratio of the circuit constant $R_{x1}(Vdc)$ when the direct-current voltage Vdc is applied to the circuit constant $R_1$ of the passive circuit element $R_1$ when the direct-current voltage Vdc is not applied and is expressed by the following expression (12).

$$k_{R1}(Vdc) = R_{x1}(Vdc)/R_1 \qquad (12)$$

The control current source $B_R$ generates the difference current $\Delta I_{R1}(Vdc)$ between the current $I_{R1}(Vdc)$ when direct-current voltage is applied and the current $I_{R1}$ flowing when no direct-current voltage is applied by multiplying the value in which one is subtracted from the inverse of the characteristic change ratio $k_{R1}(Vdc)$ by the current $I_{R1}$ flowing when no direct-current voltage is applied, as indicated by Expression (11), that is, on the basis of the characteristic change ratio $k_{R1}(Vdc)$ and the current $I_{R1}$ flowing when no direct-current voltage is applied.

Figure 13:
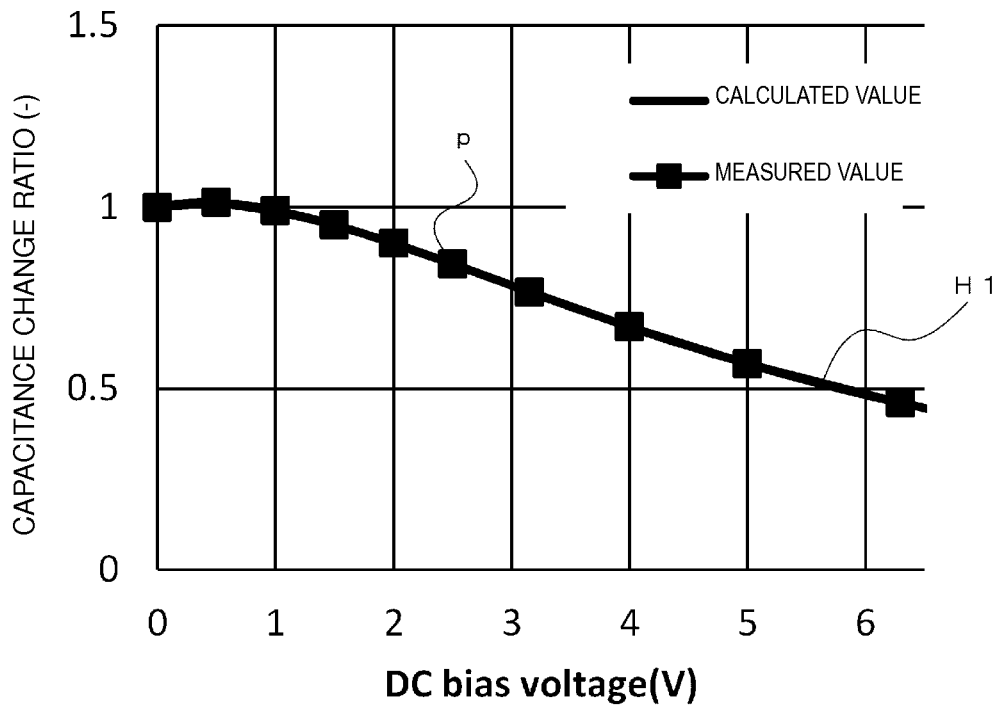
FIG. 13(a) is a graph that represents capacitance change ratio kc in the capacitor as an approximate function of the direct-current voltage Vdc applied to the capacitor and FIG. 13(b) is a graph that represents dielectric-loss change ratio Kd in the capacitor as an approximate function of the direct-current voltage Vdc applied to the capacitor.
Figure 13:
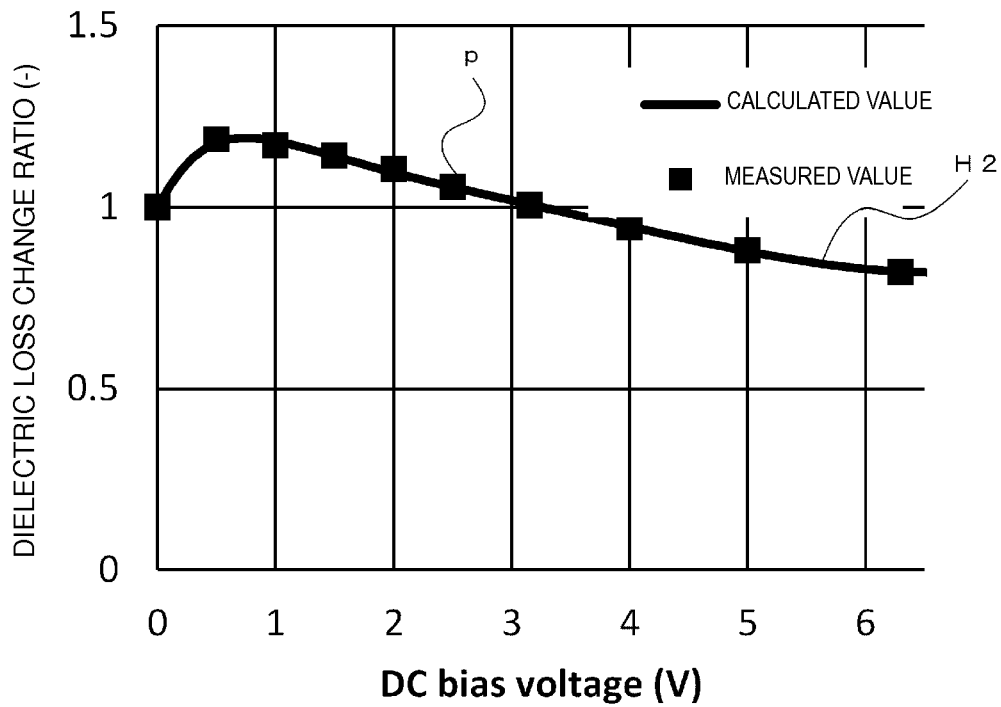

The characteristic change ratios $k_{C1}(Vdc)$ and $k_{R1}(Vdc)$ are calculated using an approximate function $\exp(f(x))$ in accordance with the reference voltage Vref ($=$Vdc). The approximate function $\exp(f(x))$ is expressed as described below (see FIG. 13) using the reference voltage Vref applied to the capacitor as a variable x on the basis of an actually measured value. In the present embodiment, the approximate function $\exp(f(x))$ is given by an even function in the form of a polynomial expression that includes no odd number exponents. The difference currents $\Delta I_{C1}(Vdc)$ and $\Delta I_{R1}(Vdc)$ expressed by Expressions (9) and (11) are given in the form of functions of the following expressions (13) and (14) using the approximate function $\exp(f(x))$.

$$\Delta I_{C1}(Vdc) = (\exp(f(x)) - 1) \cdot I_{C1} \qquad (13)$$

$$\Delta I_{R1}(Vdc) = (\exp(f(x)) - 1) \cdot I_{R1} \qquad (14)$$

In the capacitor simulation method in the present embodiment, first, the capacitor equivalent circuit is expressed using the series circuit of the passive circuit elements $R_1$ and $C_1$, and the nonlinear equivalent circuit model illustrated in FIG. 1(b) is established. Then, the characteristic change ratios $k_{R1}(Vdc)$ and $k_{C1}(Vdc)$ of the passive circuit elements $R_1$ and $C_1$ when the direct-current voltage Vdc is applied are expressed as the approximate function $\exp(f(x))$ using the reference voltage Vref as a variable x on the basis of an actually measured value. Next, the reference voltage Vref is referred to by the control current sources $B_{R1}$ and $B_{c1}$, which are connected in parallel to the passive circuit elements $R_1$ and $C_1$, respectively, and the characteristic change ratios $k_{R1}(Vdc)$ and $k_{C1}(Vdc)$ are calculated using the approximate function $\exp(f(x))$ in accordance with the reference voltage Vref. The currents $I_{R1}$ and $I_{C1}$ flowing in the passive circuit elements $R_1$ and $C_1$ when no direct-current voltage is applied measured by the voltage sources $V_{R1}$ and $V_{C1}$ are referred to by the control current sources $B_{R1}$ and $B_{c1}$. Then, the difference current $\Delta I_{R1}(Vdc)$ between the current $I_{R1}(Vdc)$ when direct-current voltage is applied and the current $I_{R1}$ when no direct-current voltage is applied and the difference current $\Delta I_{C1}(Vdc)$ between the current $I_{C1}(Vdc)$ when direct-current voltage is applied and the current $I_{C1}$ when no direct-current voltage is applied are generated by the control current sources $B_{R1}$ and $B_{c1}$ on the basis of the characteristic change ratios $k_{R1}(Vdc)$ and $k_{C1}(Vdc)$ and the currents $I_{R1}$ and $I_{C1}$ flowing when no direct-current voltage is applied, the difference currents $\Delta I_{R1}(Vdc)$ and $\Delta I_{C1}(Vdc)$ are caused to flow concurrently with the currents $I_{R1}$ and $I_{C1}$ flowing when no direct-current voltage is applied, and thus the nonlinear characteristics of the capacitor when the direct-current voltage Vdc is applied are simulated.

FIG. 3(a) is a graph that represents comparison between frequency characteristics for magnitude MagZ of capacitor impedance Z calculated from the nonlinear equivalent circuit model illustrated in FIG. 1(b) obtained by the simulation for the nonlinear characteristics of the capacitor and frequency characteristics for the same magnitude MagZ of capacitor impedance Z calculated from the passive equivalent circuit model illustrated in FIG. 1(a). The horizontal axis in this graph indicates the frequency (Hz), and the vertical axis indicates the value (Ω) of magnitude MagZ. Frequency characteristics A1 indicated by the solid line are characteristics when the applied direct-current voltage Vdc is 6 V calculated from the nonlinear equivalent circuit model. Frequency characteristics A0 indicated by the broken line are characteristics when the applied direct-current voltage Vdc is zero calculated from the passive equivalent circuit model.

FIG. 3(b) is a graph that represents comparison between frequency characteristics for equivalent series resistance ESR of the capacitor calculated from the nonlinear equivalent circuit model illustrated in FIG. 1(b) obtained by the above-described simulation for the nonlinear characteristics of the capacitor and frequency characteristics for the same equivalent series resistance ESR calculated from the passive equivalent circuit model illustrated in FIG. 1(a). The horizontal axis in this graph indicates the frequency (Hz), and the vertical axis indicates the value (Ω) of the equivalent series resistance ESR. Frequency characteristics B1 indicated by the solid line are characteristics when the applied direct-current voltage Vdc is 6 V calculated from the nonlinear equivalent circuit model. Frequency characteristics B0 indicated by the broken line are characteristics when the applied direct-current voltage Vdc is zero calculated from the passive equivalent circuit model.

As illustrated in the graph of FIG. 3(a), because of the application of the direct-current voltage Vdc, the value of Magz in the frequency characteristics A1 for the impedance magnitude MagZ is larger than that in the frequency characteristics A0 when no direct-current voltage is applied and is changed by the application of direct-current voltage Vdc. In a high-frequency range, they approach the characteristics for the equivalent series resistance ESR illustrated in FIG. 3(b). Similarly, as illustrated in the graph of FIG. 3(b), because of the application of the direct-current voltage Vdc, the value of ESR in the frequency characteristics B1 for the equivalent series resistance ESR is also larger than that in the frequency characteristics B0 when no direct-current voltage is applied and is changed by the application of the direct-current voltage Vdc. The value of the equivalent series resistance ESR in each of both the frequency characteristics B1 and B0 are fixed values independent of the frequency.

In the capacitor simulation method and capacitor nonlinear equivalent circuit model in the first embodiment, as described above, the characteristic change ratios $k_{R1}(Vdc)$ and $k_{C1}(Vdc)$ of the passive circuit elements $R_1$ and $C_1$ when the direct-current voltage Vdc is applied are expressed by the approximate function $\exp(f(x))$ using the reference voltage Vref applied to the capacitor as the variable x on the basis of an actually measured value. Accordingly, the characteristic change ratios $k_{R1}(Vdc)$ and $k_{C1}(Vdc)$ expressed by Expressions (10) and (12) are calculated using the approximate function $\exp(f(x))$ in accordance with the referred voltage Vref. The currents $I_{R1}(Vdc)$ and $I_{C1}(Vdc)$ when direct-current voltage is applied can be obtained by causing the difference currents $\Delta I_{R1}(Vdc)$ and $\Delta I_{C1}(Vdc)$ expressed by Expressions (9) and (11) to flow concurrently with the currents $I_{R1}$ and $I_{C1}$ flowing when no direct-current voltage is applied. Consequently, the difference currents $\Delta I_{R1}(Vdc)$ and $\Delta I_{C1}(Vdc)$ are generated by the control current sources $B_R$ and $B_c$ on the basis of the characteristic change ratios $k_{R1}(Vdc)$ and $k_{C1}(Vdc)$ and the currents $I_{R1}$ and $I_{C1}$ flowing when no direct-current voltage is applied, the passive circuit elements $R_1$ and $C_1$ are connected in parallel to the control current sources $B_R$ and $B_C$, and the difference currents $\Delta I_{R1}(Vdc)$ and $\Delta I_{C1}(Vdc)$ are caused to flow concurrently with the currents $I_{R1}$ and $I_{C1}$ flowing when no direct-current voltage is applied, thereby enabling simulation of the currents $I_{R1}(Vdc)$ and $I_{C1}(Vdc)$ when direct-current voltage is applied in the passive circuit elements $R_1$ and $C_1$.

That is, the characteristic change ratios $k_{R1}(Vdc)$ and $k_{C1}(Vdc)$ in the passive circuit elements $R_1$ and $C_1$ are calculated using the approximate function $\exp(f(x))$ by referring to the voltage Vref applied to the capacitor, and the difference currents $\Delta I_{R1}(Vdc)$ and $\Delta I_{C1}(Vdc)$ expressed by Expressions (9) and (11) are generated by the control current sources $B_R$ and $B_C$ on the basis of the characteristic change ratios $k_{R1}(Vdc)$ and $k_{C1}(Vdc)$ and the currents $I_{R1}$ and $I_{C1}$ flowing when no direct-current voltage is applied, thereby enabling simulation capable of performing dynamic tracking for any applied direct-current voltage Vdc. As a result, a capacitor simulation method and capacitor nonlinear equivalent circuit model enabling nonlinearity of the capacitor when direct-current voltage is applied to be dynamically simulated with high precision can be easily provided using a simple configuration. Because the capacitor nonlinear equivalent circuit model is obtained by simply causing the difference currents $\Delta I_{R1}(Vdc)$ and $\Delta I_{C1}(Vdc)$ to flow concurrently with the currents $I_{R1}$ and $I_{C1}$ flowing when no direct-current voltage is applied by the control current sources $B_R$ and $B_c$ with reference to the currents $I_{R1}$ and $I_{C1}$ flowing when no direct-current voltage is applied, as described above, the capacitor equivalent circuit model illustrated in FIG. 1(a) corresponding to the currents $I_{R1}$ and $I_{C1}$ flowing when no direct-current voltage is applied, that is, when the direct-current voltage Vdc is not applied can be easily obtained by removing the control current sources $B_R$ and $B_c$ from the nonlinear equivalent circuit model illustrated in FIG. 1(b).

With the capacitor simulation method and capacitor nonlinear equivalent circuit model in the first embodiment, when the value of the reference voltage Vref is zero (x=0), the value of the approximate function $\exp(f(x))$, which is an exponential function, is one, the value of the coefficient $(\exp(f(x))-1)$ in Expressions (13) and (14), which is multiplied to the currents $I_{R1}$ and $I_{C1}$ flowing when no direct-current voltage is applied, is zero, and the value of each of the difference currents $\Delta I_{R1}(Vdc)$ and $\Delta I_{C1}(Vdc)$ is zero. When the value of the reference voltage Vref is not zero, the value of the approximate function $\exp(f(x))$ is larger than one, and the value of the coefficient $(\exp(f(x))-1)$, which is multiplied to the currents $I_{R1}$ and $I_{C1}$ flowing when no direct-current voltage is applied, is larger than zero. Thus, the difference currents $\Delta I_{R1}(Vdc)$ and $\Delta I_{C1}(Vdc)$ are calculated in accordance with the reference voltage Vref on all occasions, the characteristics of the capacitor are simulated, and the results are utilized for understanding the quality of the capacitor.

With the capacitor simulation method and capacitor nonlinear equivalent circuit model in the first embodiment, the approximate function $\exp(f(x))$ is represented as an even function in the form of a polynomial expression that includes no odd number exponents. Thus, unlike known capacitor simulations, even if the sign of the direct-current bias is inversed or the value of the direct-current bias changes suddenly, the characteristic change ratios $k_{R1}(Vdc)$ and $k_{C1}(Vdc)$ can be appropriately approximated by the approximate function $\exp(f(x))$.

With the capacitor simulation method and capacitor nonlinear equivalent circuit model in the first embodiment, unlike a method of performing calculation by setting the reference voltage Vref or the currents $I_{R1}$ and $I_{C1}$ flowing when no direct-current voltage is applied separately from the equivalent circuit model, an instantaneous voltage occurring across the circuit in the equivalent circuit model or an instantaneous current occurring at the input terminal or output terminal of each of the passive circuit elements $R_1$ and $C_1$ in the equivalent circuit model is referred to, and the difference currents $\Delta I_{R1}(Vdc)$ and $\Delta I_{C1}(Vdc)$ are calculated. Thus, the reference voltage Vref and the currents $I_{R1}$ and $I_{C1}$ flowing when no direct-current voltage is applied for use in calculation of the difference currents $\Delta I_{R1}(Vdc)$ and $\Delta I_{C1}(Vdc)$ can be referred to without time lags, and transient response analysis for nonlinearity of the capacitor can be made at high speed and with high precision.

Figure 4:
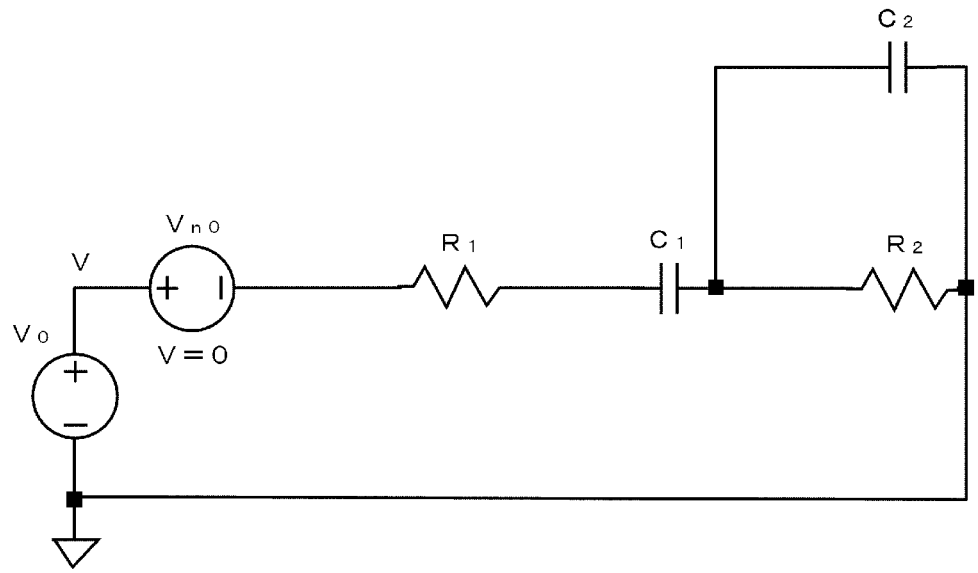
FIG. 4(a) is a circuit diagram that illustrates a capacitor passive equivalent circuit model when no direct-current voltage is applied in a second embodiment of the present disclosure and FIG. 4(b) is a circuit diagram that illustrates a capacitor nonlinear equivalent circuit model when direct-current voltage is applied in the second embodiment.
Figure 4:
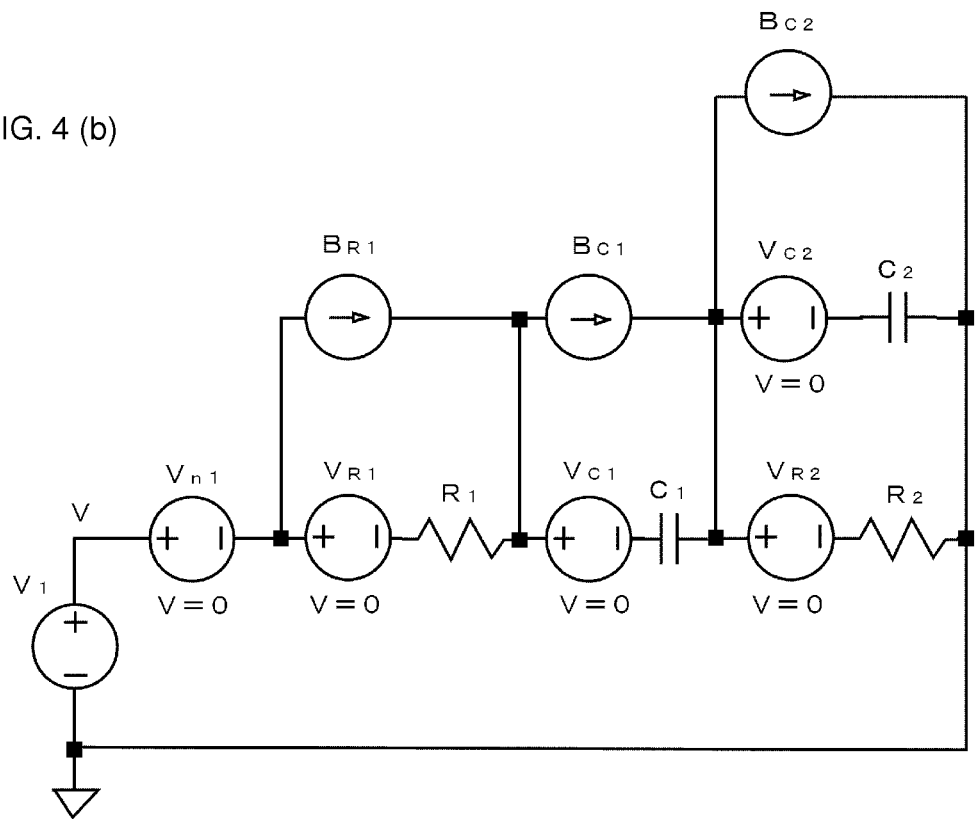

FIG. 4(a) is a circuit diagram that illustrates a capacitor passive equivalent circuit model when no direct-current voltage is applied in a second embodiment of the present disclosure. FIG. 4(b) is a circuit diagram that illustrates a capacitor nonlinear equivalent circuit model when direct-current voltage is applied in the second embodiment. In FIG. 4, the portions identical with or corresponding to those in FIG. 1 have the same reference numerals, and the description thereof is omitted.

In the passive equivalent circuit model and nonlinear equivalent circuit model in the second embodiment, the series circuit of the resistive element R1 and the capacitive element $C_1$ is connected in series to the parallel circuit of the capacitive element $C_2$ and the resistive element $R_2$, and they constitute a passive circuit element that represents a capacitor equivalent circuit being a target for simulation.

Figure 5:
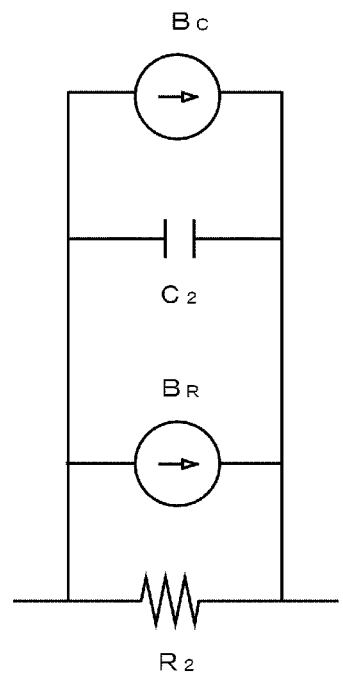
FIG. 5(a) illustrates a parallel circuit of a resistive element $R_2$ whose nonlinear characteristics when direct-current voltage is applied are represented using a control current source $B_R$ and a capacitive element $C_2$ whose nonlinear characteristics when direct-current voltage is applied are represented using a control current source $B_C$ and FIG. 5(b) illustrates a parallel circuit of the resistive element $R_2$ and the capacitive element $C_2$ whose nonlinear characteristics when direct-current voltage is applied are represented using a single control current source $(B_R+B_C)$.
Figure 5:
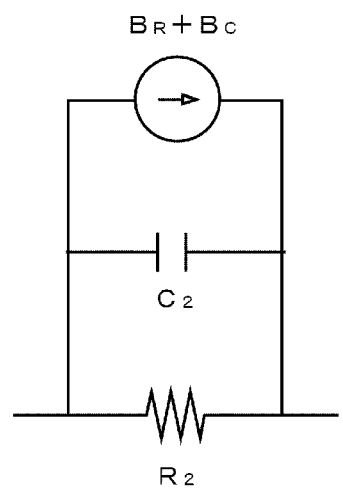

When the parallel circuit of the capacitive element $C_2$ and the resistive element $R_2$ is transformed into a nonlinear equivalent model, as illustrated in FIG. 5(a), the resistive element $R_2$, whose circuit constant is independent of the direct-current voltage Vdc, is connected in parallel to the control current source $B_R$ handled as a behavior current source model, and the capacitive element $C_2$, whose circuit constant is independent of the direct-current voltage Vdc, is connected in parallel to the control current source $B_C$ handled as a behavior current source model. However, these control current sources $B_R$ and $B_c$, which are connected in parallel, can be expressed as a single control current source $(B_R+B_C)$, as illustrated in FIG. 5(b). The value of a current generated by the control current source $(B_R+B_C)$ is the sum of the value of a current generated by the control current source $B_C$ and that by the control current source $B_R$.

Accordingly, in the nonlinear equivalent circuit model illustrated in FIG. 4(b), the resistive element $R_1$ is connected in parallel to the control current source $B_{R1}$, the capacitive element $C_1$ is connected in parallel to the control current source $B_{C1}$, and the parallel circuit of the capacitive element $C_2$ and the resistive element $R_2$ is connected in parallel to a control current source $B_{C2}$ corresponding to the control current source ($B_R+B_C$) illustrated in FIG. 5(b). That is, in each equivalent circuit model in the second embodiment, the plurality of parallel circuits, that is, the parallel circuit of the control current source $B_{R1}$ and the passive circuit element $R_1$, the parallel circuit of the control current source $B_{C1}$ and the passive circuit element $C_2$, and the parallel circuit of the control current source $B_{C2}$ and the passive circuit elements $C_2$ and $R_2$ are connected in series. The input terminal of the capacitive element $C_2$ is connected to a voltage source model $V_{C2}$, the input terminal of the resistive element $R_2$ is connected to a voltage source model $V_{R2}$, and currents flowing in the capacitive element $C_2$ and the resistive element $R_2$ are measured by the voltage source models $V_{C2}$ and $V_{R2}$, respectively.

In the second embodiment, in the passive equivalent circuit model illustrated in FIG. 4(a), the alternating-current voltage Vac in which the direct-current voltage Vdc is not applied across the equivalent circuit by the voltage source model $V_0$ as the voltage V. In the nonlinear equivalent circuit model illustrated in FIG. 4(b), the alternating-current voltage Vac in which the direct-current voltage Vdc is applied is applied across the equivalent circuit by the voltage source model $V_1$ as the voltage V. Here, the circuit constant of the capacitive element $C_1$ in each equivalent circuit is set to 8 μF, the circuit constant of the resistive element $R_1$ is set to 2.5 mΩ, the circuit constant of the capacitive element $C_2$ is set to 1 mF, the circuit constant of the resistive element $R_2$ is set to 10 mΩ, and the applied direct-current voltage Vdc is set to 6 V.

The control current source $B_{R1}$ illustrated in FIG. 4(b) generates the difference current $\Delta I_{R1}$(Vdc) between the current $I_{R1}$(Vdc) when direct-current voltage is applied and the current $I_{R1}$ flowing when no direct-current voltage is applied in the resistive element $R_1$ on the basis of the characteristic change ratio $k_{R1}$(Vdc) and the current $I_{R1}$ flowing when no direct-current voltage is applied in the resistive element $R_1$, as in the simulation method in the first embodiment. The control current source $B_{C1}$ generates the difference current $\Delta I_{C1}$(Vdc) between the current $I_{C1}$(Vdc) when direct-current voltage is applied and the current $I_{C1}$ flowing when no direct-current voltage is applied in the capacitive element $C_1$ on the basis of the characteristic change ratio $k_{C1}$(Vdc) and the current $I_{C1}$ flowing when no direct-current voltage is applied in the capacitive element $C_1$, as in the control current source $B_{R1}$. The control current source $B_{C2}$ generates a difference current $\Delta I_{C1}$(Vdc)+$\Delta I_{R1}$(Vdc) on the basis of the characteristic change ratio $k_{C2}$(Vdc) in the capacitive element $C_2$, the characteristic change ratio $k_{R2}$(Vdc) in the resistive element $R_2$, the current Ice flowing when no direct-current voltage is applied in the capacitive element C2, and the current $I_{R2}$ flowing when no direct-current voltage is applied in the resistive element $R_2$. The difference current $\Delta I_{C1}$(Vdc)+$\Delta I_{R1}$(Vdc) is the sum of the difference current $\Delta I_{C1}$(Vdc) between the current $I_{C1}$(Vdc) when direct-current voltage is applied and the current $I_{C1}$ flowing when no direct-current voltage is applied in the capacitive element $C_2$ and the difference current $\Delta I_{R1}$(Vdc) between the current $I_{R2}$(Vdc) when direct-current voltage is applied and the current $I_{R2}$ flowing when no direct-current voltage is applied in the resistive element $R_2$.

Figure 6:
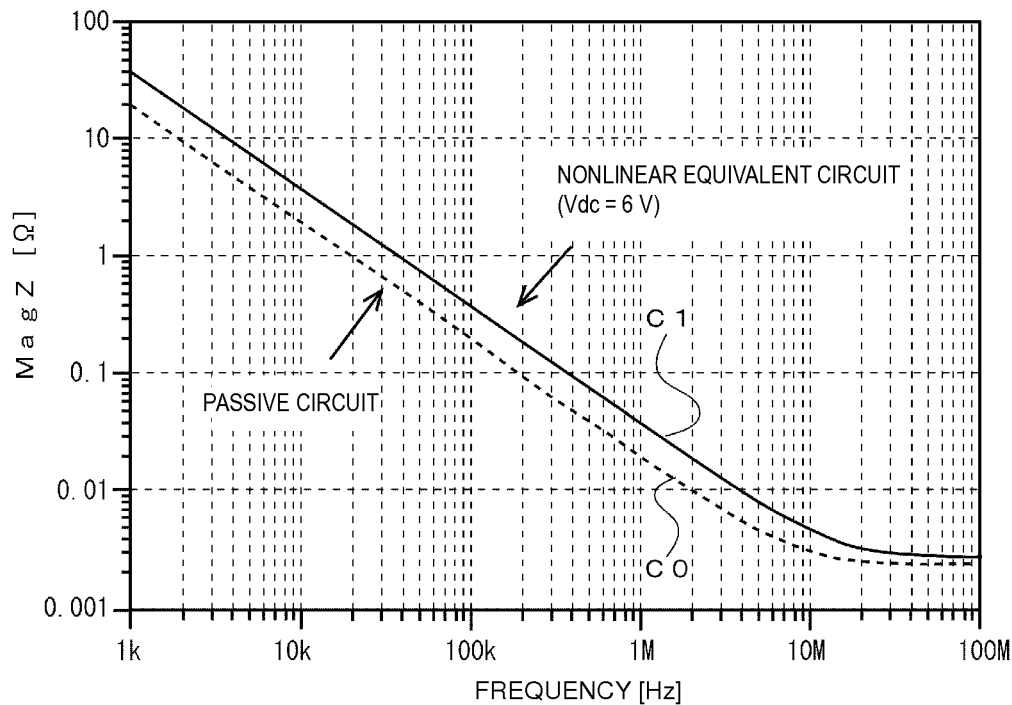
FIG. 6(a) is a graph that represents frequency characteristics for magnitude MagZ of capacitor impedance Z calculated from the nonlinear equivalent circuit model illustrated in FIG. 4(b) in comparison with characteristics calculated from the passive equivalent circuit model illustrated in FIG. 4(a) and FIG. 6(b) is a graph that represents frequency characteristics for capacitor equivalent series resistance ESR calculated from the nonlinear equivalent circuit model illustrated in FIG. 4(b) in comparison with characteristics calculated from the passive equivalent circuit model illustrated in FIG. 4(a).
Figure 6:
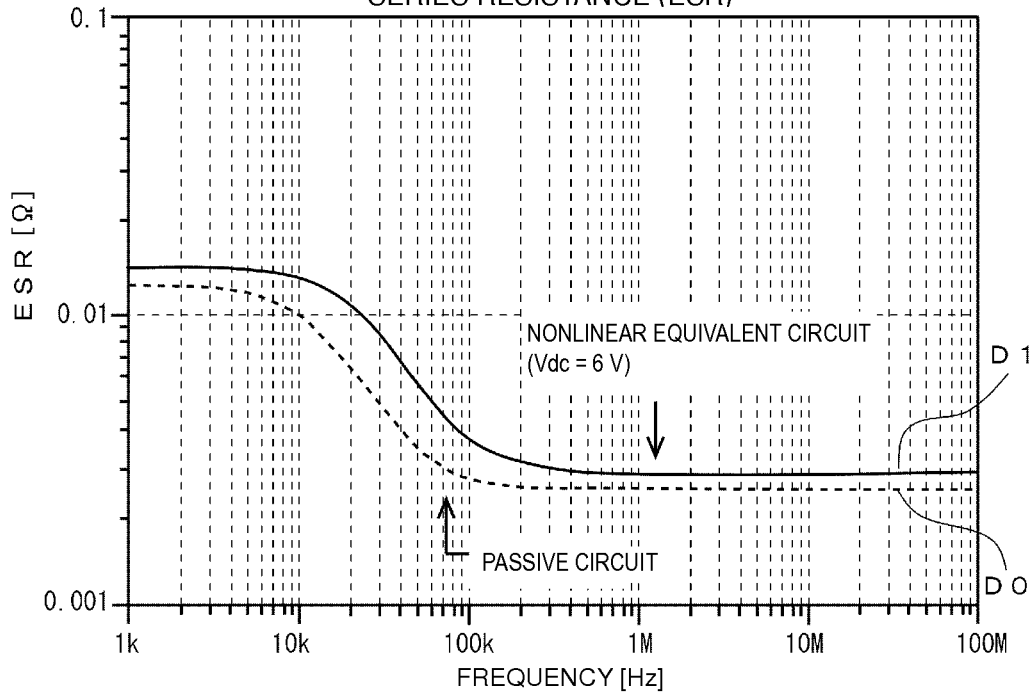

FIG. 6(a) is a graph that represents comparison between frequency characteristics for magnitude MagZ of capacitor impedance Z calculated from the nonlinear equivalent circuit model illustrated in FIG. 4(b) and frequency characteristics for the same magnitude MagZ calculated from the passive equivalent circuit model illustrated in FIG. 4(a). The horizontal axis in this graph indicates the frequency (Hz), and the vertical axis indicates the value (Ω) of magnitude MagZ. Frequency characteristics $C_1$ indicated by the solid line are characteristics when the applied direct-current voltage Vdc is 6 V calculated from the nonlinear equivalent circuit model. Frequency characteristics C0 indicated by the broken line are characteristics when the applied direct-current voltage Vdc is zero calculated from the passive equivalent circuit model.

FIG. 6(b) is a graph that represents comparison between frequency characteristics for equivalent series resistance ESR of the capacitor calculated from the nonlinear equivalent circuit model illustrated in FIG. 4(b) and frequency characteristics for the same equivalent series resistance ESR calculated from the passive equivalent circuit model illustrated in FIG. 4(a). The horizontal axis in this graph indicates the frequency (Hz), and the vertical axis indicates the value (Ω) of the equivalent series resistance ESR. Frequency characteristics D1 indicated by the solid line are characteristics when the applied direct-current voltage Vdc is 6 V calculated from the nonlinear equivalent circuit model. Frequency characteristics D0 indicated by the broken line are characteristics when the applied direct-current voltage Vdc is zero calculated from the passive equivalent circuit model.

As illustrated in the graph of FIG. 6(a), because of the application of the direct-current voltage Vdc, the value of Magz in the frequency characteristics C1 for the impedance magnitude MagZ is also larger than that in the frequency characteristics C0 when no direct-current voltage is applied and is changed by the application of the direct-current voltage Vdc, as in the frequency characteristics A1 illustrated in the graph of FIG. 3(a). In a high-frequency range, they approach the characteristics for the equivalent series resistance ESR illustrated in FIG. 6(b). Similarly, as illustrated in the graph of FIG. 6(b), because of the application of the direct-current voltage Vdc, the value of ESR in the frequency characteristics D1 for the equivalent series resistance ESR is also larger than that in the frequency characteristics D0 when no direct-current voltage is applied and is changed by the application of the direct-current voltage Vdc, as in the frequency characteristics B1 illustrated in the graph of FIG. 3(b). The value of the equivalent series resistance ESR in each of both the frequency characteristics D1 and D0 varies in accordance with the frequency and has frequency characteristics, unlike the value in each of both the frequency characteristics B1 and B0 illustrated in the graph of FIG. 3(b).

With the capacitor simulation method and capacitor nonlinear equivalent circuit model in the second embodiment, the simple parallel circuit of the control current source $B_{R1}$ and the resistive element $R_1$, the simple parallel circuit of the control current source $B_{C1}$ and the capacitive element $C_1$, and the simple parallel circuit of the control current source $B_{C2}$ and the passive circuit elements $C_2$ and $R_2$ are simply connected in series. An increased number of connections in series can enhance the accuracy of simulation of the equivalent circuit model. Thus, the equivalent circuit model with high accuracy of simulation can be configured in a regular and transparent manner. Because the plurality of parallel circuits of the control current sources $B_{R1}$, $B_{c1}$, and $B_{c2}$ and the passive circuit elements $R_1$, $C_1$, $C_2$, and $R_2$ are simply connected in series, the characteristics of the passive circuit elements $R_1$, $C_1$, $C_2$, and $R_2$ when direct-current voltage is applied can be simulated by a systematic calculation procedure.

Figure 7:
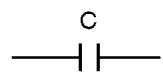
FIGS. 7(a), (b), and (c) illustrate configurations of passive circuit elements representing characteristics when direct-current voltage Vdc is not applied and being used in the passive equivalent circuit model in each embodiment of the present disclosure and FIGS. 7(d), (e), and (f) illustrate configurations of passive circuit elements representing characteristics when the direct-current voltage Vdc is applied and being used in the nonlinear equivalent circuit model in each embodiment.
Figure 7:
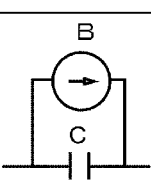
Figure 7:
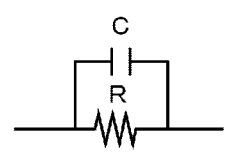
Figure 7:
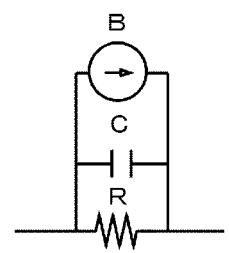
Figure 7:
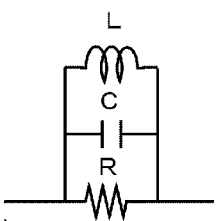
Figure 7:
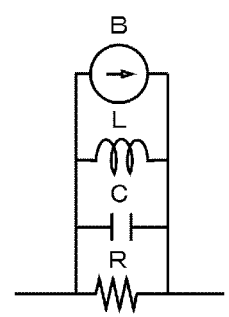

In the above-described passive equivalent circuit model in the first embodiment, as illustrated in FIG. 7(a), the characteristics of the passive circuit element when the direct-current voltage Vdc is not applied are represented by the configuration in which the single circuit of the capacitive element C constitutes the passive circuit element. In the nonlinear equivalent circuit model, as illustrated in FIG. 7(d), the circuit illustrated in FIG. 7(a) is connected in parallel to the control current source B, and thus the characteristics of the passive circuit elements when the direct-current voltage Vdc is applied are simulated. In the above-described passive equivalent circuit model in the second embodiment, as illustrated in FIG. 7(b), the characteristics of the passive circuit elements when the direct-current voltage Vdc is not applied are represented by the configuration in which the parallel circuit of the capacitive element C and the resistive element R also constitutes the passive circuit elements. In the nonlinear equivalent circuit model, as illustrated in FIG. 7(e), the parallel circuit illustrated in FIG. 7(b) is connected in parallel to the control current source B, and thus the characteristics of the passive circuit elements when the direct-current voltage Vdc is applied are simulated.

As in the passive equivalent circuit model illustrated in FIG. 7(c), a parallel circuit of an inductive element L, capacitive element C, and resistive element R may constitute the passive circuit elements. In this case, in the nonlinear equivalent circuit model, as illustrated in FIG. 7(f), that parallel circuit is connected in parallel to the control current source B. Even in this configuration of the passive circuit elements, the characteristics of the passive circuit elements when the direct-current voltage Vdc is not applied are represented by the parallel circuit of the inductive circuit L, capacitive element C, and resistive element R. That circuit is connected in parallel to the control current source B, and thus the characteristics when the direct-current voltage Vdc is applied to the capacitor are simulated.

In the above-described first embodiment and second embodiment, the cases where the characteristics of all of the passive circuit elements $C_1$, $R_1$, $C_2$, and $R_2$ are changed by the application of the direct-current voltage Vdc are described. However, as in the impedance-developed passive equivalent circuit model illustrated in FIG. 8(a), the equivalent circuit may include passive circuit elements r and l whose characteristics are not changed by the application of the direct-current voltage Vdc to the capacitor, in addition to the passive circuit elements R, L, and C whose characteristics are changed by the application of the direct-current voltage Vdc. Whether the characteristics are changed or not changed by the application of the direct-current voltage Vdc is determined by analysis of actually measured values. In this case, in the impedance-developed nonlinear equivalent circuit model illustrated in FIG. 8(b), the passive circuit elements R, L, and C, whose characteristics are changed by the application of the direct-current voltage Vdc, are connected in parallel to the control current sources B, the passive circuit elements r and l are not connected to the control current sources B, and thus the characteristics when the direct-current voltage Vdc is applied to the capacitor are simulated. Here, the cases where the equivalent circuit model is configured in an impedance-developed manner are described. Each equivalent circuit model may also be configured in an admittance-developed manner such that passive circuit elements are connected in parallel to each other.

Figure 8:
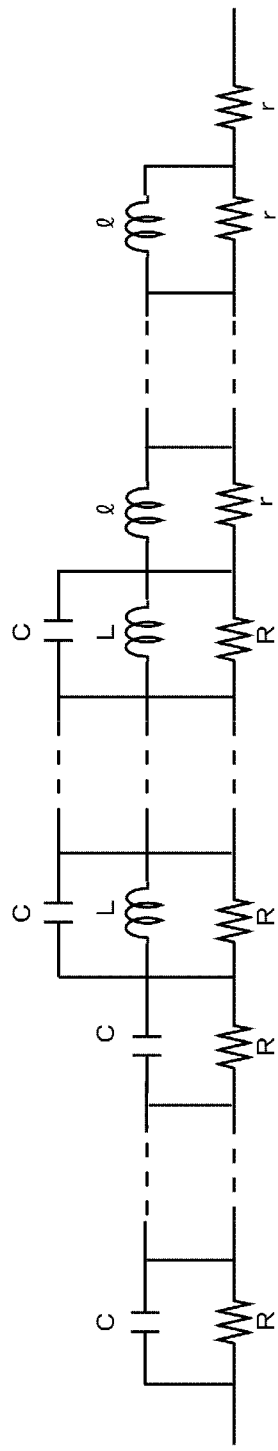
FIG. 8(a) is a circuit diagram that illustrates an impedance-developed passive equivalent circuit model including passive circuit elements r, c, and l whose characteristics are not changed by application of the direct-current voltage Vdc to capacitors
FIG. 8(b) is a circuit diagram that illustrates an impedance-developed nonlinear equivalent circuit model including these passive circuit elements r, c, and l.
Figure 8:
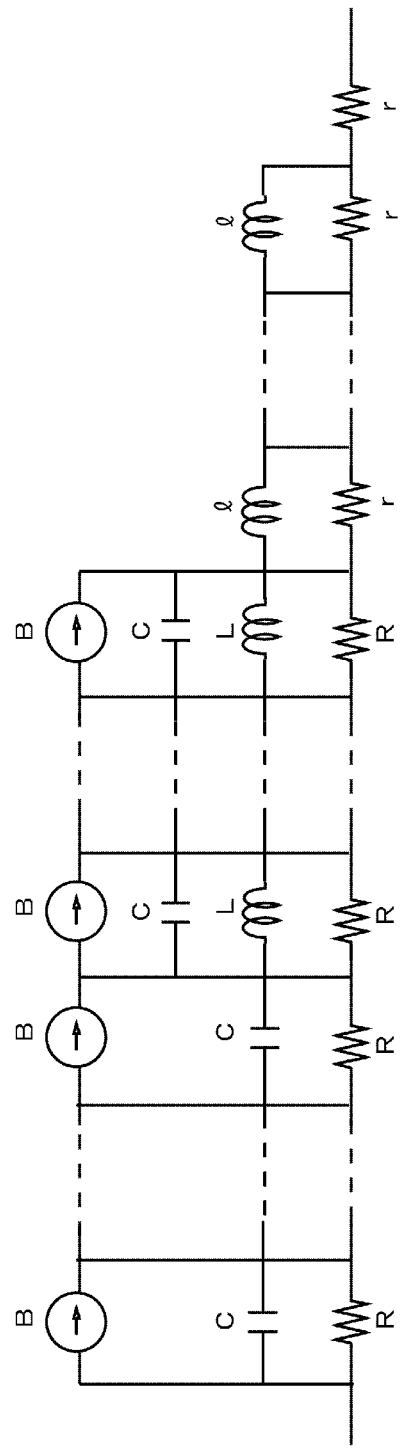
Figure 9:
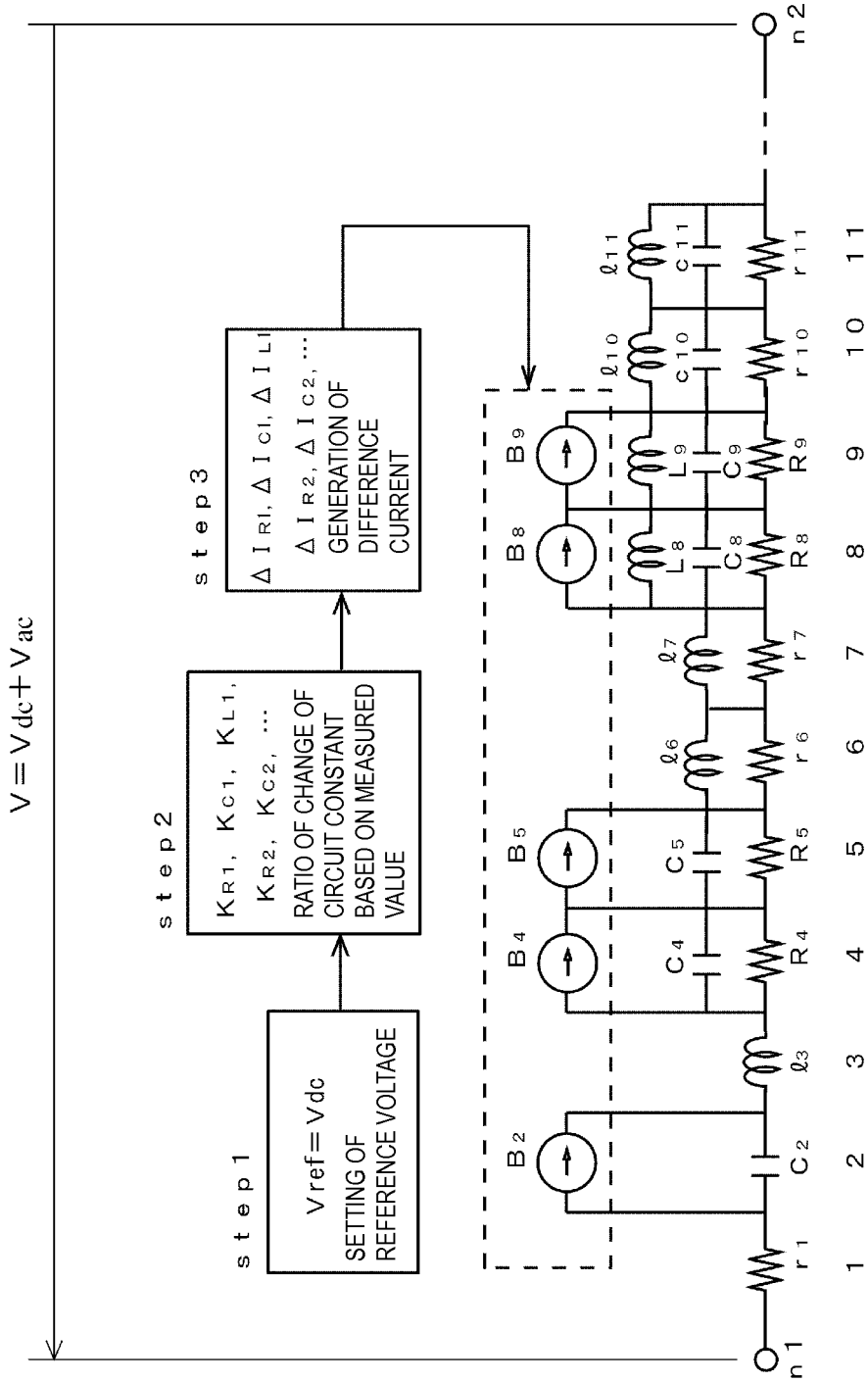
FIG. 9 is a circuit diagram that illustrates a nonlinear equivalent circuit model in a third embodiment of the present disclosure by representing the nonlinear equivalent circuit model illustrated in FIG. 8(b) as a generalized format.

FIG. 9 is a circuit diagram that illustrates a nonlinear equivalent circuit model in a third embodiment of the present disclosure by representing the nonlinear equivalent circuit model illustrated in FIG. 8(b) as a generalized format. In FIG. 9, the portions identical with or corresponding to those in FIG. 8(b) have the same reference numerals, and the description thereof is omitted.

In the capacitor simulation method using the general-format nonlinear equivalent circuit model illustrated in FIG. 9, first, the capacitor equivalent circuit is represented using passive circuit elements Rx, Lx, Cx, rx, lx, and cx, and the nonlinear equivalent circuit model illustrated in FIG. 9 is established. Here, the suffix x (x=1, 2, 3, . . . ) on each circuit element indicates the element position 1, 2, 3, . . . of the element numbered from the left to right in sequence in FIG. 9 when the position of the leftmost element in the drawing is defined as 1. Hereinafter, the suffix x is added to each circuit element in the same manner. The capacitive element cx is a passive circuit element whose characteristics are not changed by superimposition of the direct-current voltage Vdc on the inductor, as in the case of the resistive element r and inductive element l. Next, the voltage V (=Vdc+Vac) in which the direct-current voltage Vdc is applied to the alternating-current voltage Vac is applied between both terminals n1 and n2 of the nonlinear equivalent circuit model by a voltage source model $V_1$, which is substantially the same as that in FIG. 1.

In step 1, of the voltage V, the direct-current voltage Vdc is referred to as the reference voltage Vref (Vref=Vdc) by the control current sources Bx connected in parallel to the passive circuit elements Rx, Cx, and Lx. Here, only the direct-current voltage Vdc of the voltage V is referred to. Both the direct-current voltage Vdc and the alternating-current voltage Vac may be referred to. Next, in step 2, the characteristic change ratios $k_{RX}$(Vref), $k_{CX}$(Vref), and $k_{LX}$(Vref) of the passive circuit elements Rx, Cx, and Lx when the direct-current voltage Vdc is applied are represented as the approximate function exp(f(x)) using the reference voltage Vref as the variable x on the basis of measured values. Then, the characteristic change ratios $k_{RX}$(Vref), $k_{CX}$(Vref), and $k_{LX}$(Vref) are calculated using the approximate function exp(f(x)) by the control current sources $B_x$ in accordance with the reference voltage Vref.

Next, in step 3, the currents $I_{RX}$, $I_{CX}$, and $I_{LX}$ flowing in the passive circuit elements Rx, Cx, and Lx when no direct-current voltage is applied are referred to by the control current sources $B_X$. Then, difference currents $\Delta I_{RX}$(Vref), $\Delta I_{CX}$(Vref), and $\Delta I_{LX}$(Vref) between currents $I_{RX}$(Vref), $I_{CX}$(Vref), and $I_{LX}$(Vref) when direct-current voltage is applied and the currents $I_{RX}$, $I_{CX}$, and $I_{LX}$ flowing when no direct-current voltage is applied are generated by the control current sources $B_X$ on the basis of the characteristic change ratios $k_{RX}$(Vref), $k_{CX}$(Vref), and $k_{LX}$(Vref) and the currents $I_{RX}$, $I_{CX}$, and $I_{LX}$ flowing when no direct-current voltage is applied. The difference currents $\Delta I_{RX}$(Vref), $\Delta I_{CX}$(Vref), and $\Delta I_{LX}$(Vref) are caused to flow concurrently with the currents $I_{RX}$, $I_{CX}$, and $I_{LX}$ flowing when no direct-current voltage is applied, and thus the nonlinear characteristics of the capacitor when the direct-current voltage Vdc is applied are simulated.

With such capacitor simulation in the third embodiment, because the equivalent circuit model includes combination of the passive circuit elements Rx, Cx, and Lx, whose characteristics are changed by the application of the direct-current voltage Vdc, and the passive circuit elements rx, cx, and lx, whose characteristics are not changed by the application of the direct-current voltage Vdc, the precision of the simulation of the nonlinear characteristics of the capacitor can be further enhanced, and the frequency band of the simulation can be widened.

Figure 10:
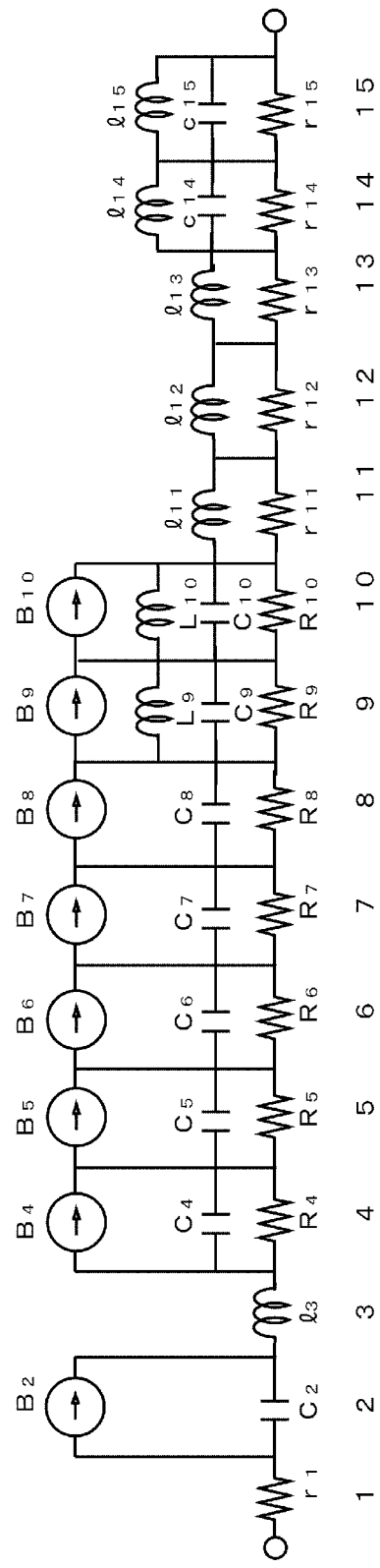
FIG. 10 is a circuit diagram that illustrates one specific example of a capacitor impedance-developed equivalent circuit model in a fourth embodiment of the present disclosure, the equivalent circuit model including a combination of passive circuit elements whose characteristics are not changed by application of the direct-current voltage Vdc.

FIG. 10 is a circuit diagram that illustrates one specific example of a capacitor impedance-developed equivalent circuit model in a fourth embodiment of the present disclosure. The equivalent circuit model includes combination of the passive circuit elements rx, cx, and lx, whose characteristics are not changed by application of the direct-current voltage Vdc. In FIG. 10, the portions identical with or corresponding to those in FIG. 9 have the same reference numerals, and the description thereof is omitted.

The circuit elements at the element positions 1 to 3 in this impedance-developed equivalent circuit model constitute a main resonant circuit and fit the frequency characteristics in the vicinity of a main resonant frequency of the capacitor being simulated to actual characteristics. The circuit elements at the element positions 4 to 8 constitute a capacitive circuit and fit the frequency characteristics in a capacitive band of the capacitor being simulated to actual characteristics. The circuit elements at the element positions 9 and 10 constitute a sub resonant circuit A, the circuit elements at the element positions 14 and 15 constitute a sub resonant circuit B, and they fit the frequency characteristics in the vicinity of a sub resonant frequency of the capacitor being simulated to actual characteristics. The circuit elements at the element positions 11 to 13 constitute an inductive circuit and fit the frequency characteristics in an inductive band of the capacitor being simulated to actual characteristics.

Table 1 provided below shows the circuit constants of the circuit elements illustrated in FIG. 10 derived when the direct-current voltage Vdc is not applied (Vdc=0 V).

TABLE 1

| No | R, r(mΩ) | C, c(μF) | L, l(pH) | |
|---|---|---|---|---|
| 1 | 2.46E+00 | — | — | Main Resonant Circuit |
| 2 | — | 8.14E+00 | — | |
| 3 | — | — | 1.17E+02 | |
| 4 | 5.81E+03 | 5.50E+02 | — | Capacitive Circuit |
| 5 | 5.58E+02 | 7.16E+02 | — | |
| 6 | 6.43E+01 | 8.86E+02 | — | |
| 7 | 7.07E+00 | 1.40E+03 | — | |
| 8 | 1.74E+00 | 1.25E+03 | — | |
| 9 | 1.63E+00 | 9.36E+01 | 2.01E+01 | Sub Resonant Circuit A |
| 10 | 2.95E+00 | 2.42E+01 | 4.60E+01 | |
| 11 | 1.50E+01 | — | 3.66E+02 | Inductive Circuit |
| 12 | 3.20E+01 | — | 6.04E+01 | |
| 13 | 9.73E+01 | — | 2.32E+01 | |
| 14 | 4.77E+03 | 1.01E−05 | 4.24E+01 | Sub Resonant Circuit B |
| 15 | 1.00E+08 | 4.73E−06 | 5.25E+01 | |

In the above table, "No" in the left column indicates the element positions 1 to 15, and the circuit constants of the resistive elements R and r (mΩ), capacitive elements C and c (μF), and inductive elements L and l (pH) for corresponding element positions are shown. Each of the circuit constants are represented by a power of 10. For example, 5.81E+03 indicates $5.81 \times 10^3$ (=5.81×1000), "E" indicates the base 10, and +03 indicates the exponent. Similarly, 1.01E−05 indicates $1.01 \times 10^{-5}$ (=1.01×0.00001).

Figure 11:
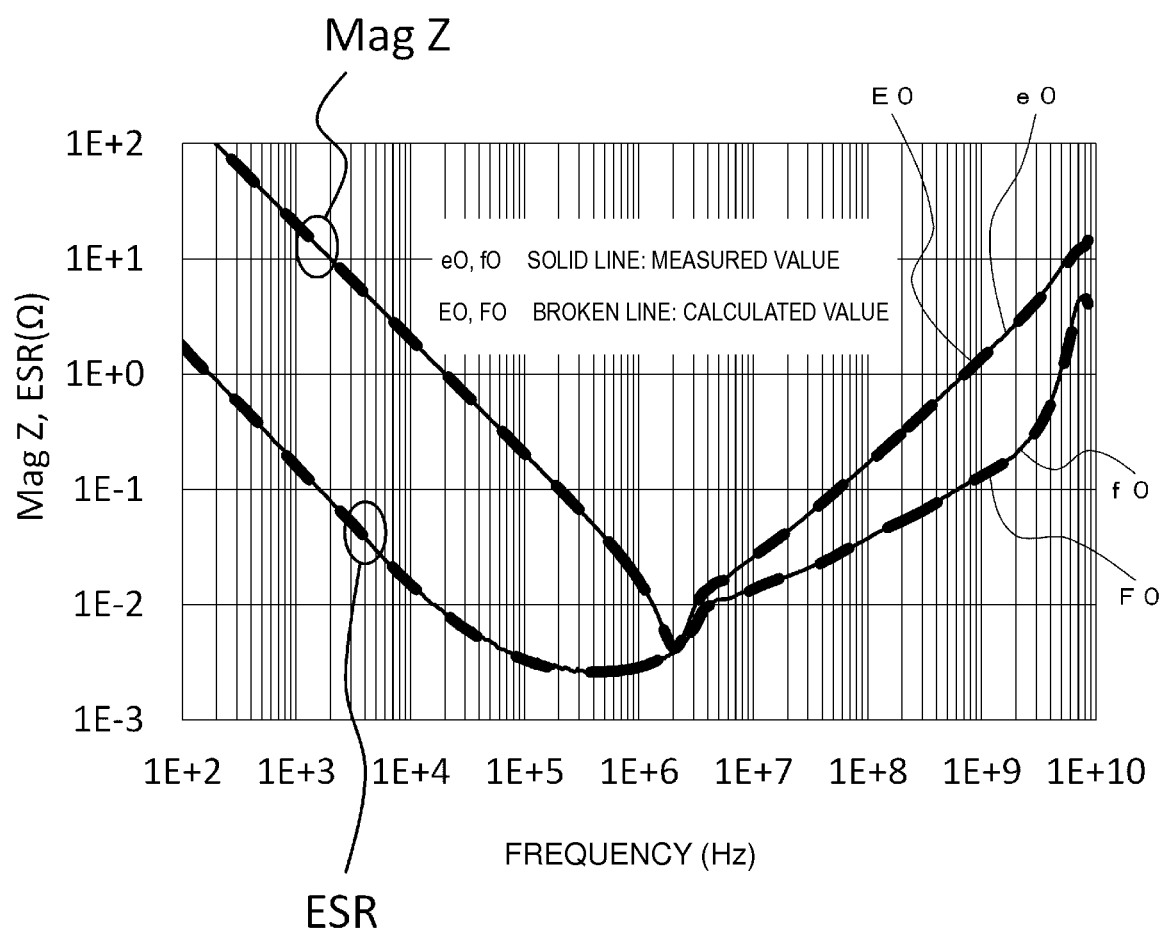
FIG. 11 is a graph that represents calculated values of magnitude MagZ of capacitor impedance Z and equivalent series resistance ESR when the direct-current voltage Vdc is not applied, the calculated values being obtained using the equivalent circuit model illustrated in FIG. 10, in comparison with measured values.

FIG. 11 is a graph that represents calculated values of magnitude MagZ of capacitor impedance Z and equivalent series resistance ESR when the direct-current voltage Vdc is not applied (Vdc=0 V), the calculated values being obtained using the equivalent circuit model illustrated in FIG. 10, in comparison with measured values. The horizontal axis in this graph indicates the frequency (Hz), and the vertical axis indicates the value (Ω) of the equivalent series resistance ESR. The scales of the axes are the above-described powers of 10. The measured values of the magnitude MagZ are represented by a characteristic line e0, which is indicated by the solid line, and the calculated values thereof are represented by a characteristic line E0, which is indicated by the broken line. The measured values of the equivalent series resistance ESR are represented by a characteristic line f0, which is indicated by the solid line, and the calculated values thereof are represented by a characteristic line F0, which is indicated by the broken line.

The graph in FIG. 11 shows that the calculated values of both the magnitude MagZ of impedance Z and the equivalent series resistance ESR are satisfactorily fit to the measured values over the range of 100 Hz to 8.5 GHz.

In the above-described fitting, the change ratios in characteristic values of the passive circuit elements R, C, and L changed by the application of the direct-current voltage Vdc to the capacitor are expressed as dimensionless coefficients on the basis of the characteristic change ratios arising from the material of the dielectric of the capacitor. The characteristic values of the circuit elements included in the above-described main resonant circuit, sub resonant circuit A or B, capacitive circuit, or inductive circuit are corrected to values corresponding to the direct-current voltage Vdc applied to the capacitor under a predetermined applied rule.

In the present embodiment, the dimensionless coefficients are set for the capacitive element C or resistive element R, whose characteristic value is changed in response to the application of the direct-current voltage Vdc to the capacitor, on the basis of either one or both of the capacitance change ratio Kc and dielectric-loss change ratio Kd of the capacitor measured when the direct-current voltage Vdc is applied to the capacitor. The applied rule is a rule of multiplying the characteristic value of a circuit element, whose characteristic value varies in accordance with the applied direct-current voltage Vdc to the capacitor, when no direct-current voltage Vdc is applied by a dimensionless coefficient. The correction of the characteristic value is made by multiplying a capacitance value of the capacitive element C, whose capacitance value varies in accordance with the direct-current voltage Vdc applied to the capacitor, when no direct-current voltage is applied and a resistance vale of the resistive element R, whose resistance value varies in accordance with the applied direct-current voltage Vdc, when no direct-current voltage is applied by the dimensionless coefficient under the applied rule. This multiplication by the dimensionless coefficient under the applied rule is made by multiplication and/or division of either one or combination of both of the capacitance change ratio Kc and dielectric-loss change ratio Kd as described below.

Figure 12:
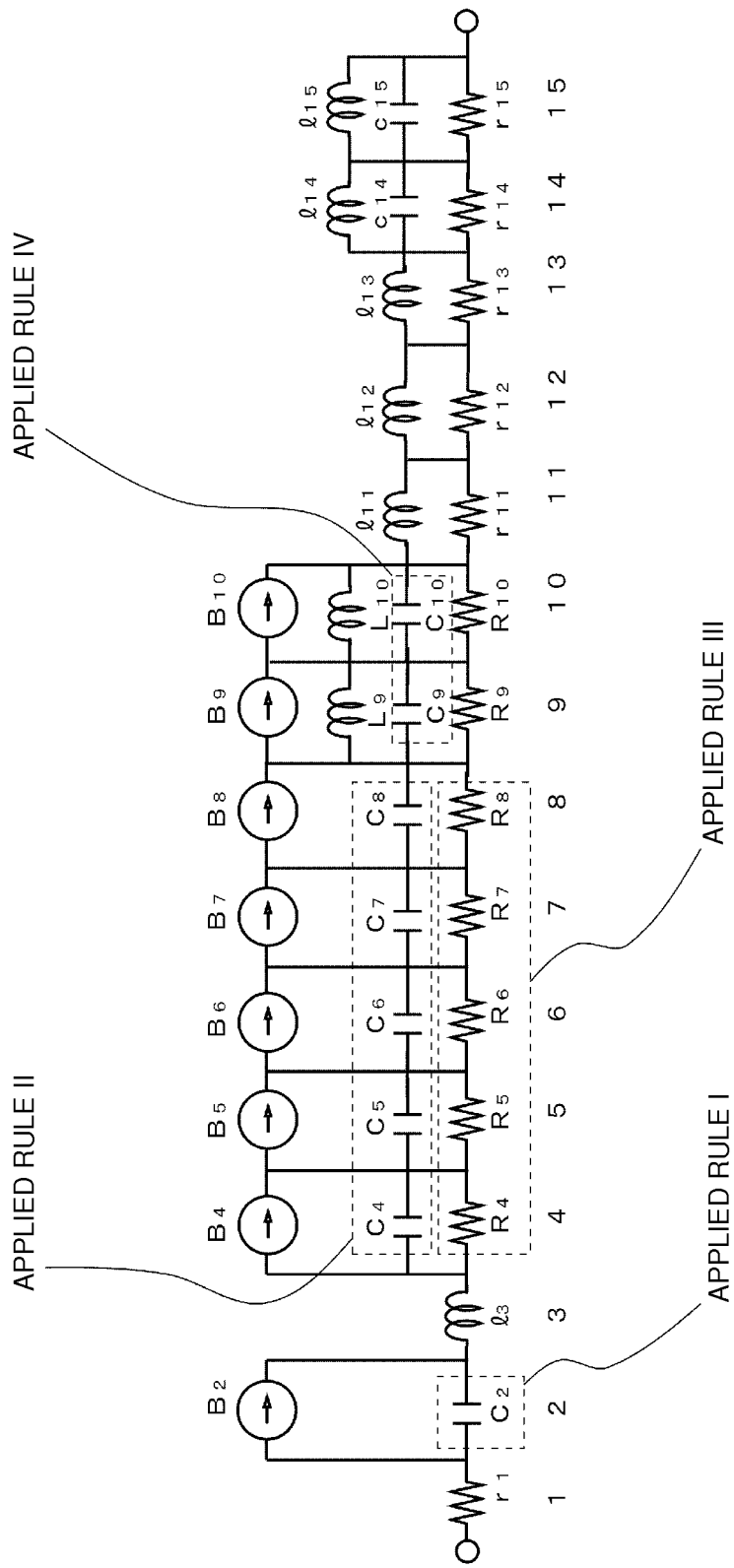
FIG. 12 is a circuit diagram for describing applied rules used in correcting characteristics of circuit elements included in the impedance-developed equivalent circuit model in the fourth embodiment.

FIG. 12 is a circuit diagram for describing the applied rules. In FIG. 12, the portions identical with or corresponding to those in FIG. 10 have the same reference numerals, and the description thereof is omitted.

The changes in characteristics of the capacitive element $C_2$ caused by the application of the direct-current voltage Vdc arise from the material of the dielectric. Accordingly, in the main resonant circuit including the circuit elements at the element positions 1 to 3, it is necessary to correct the characteristics of the capacitive element $C_2$ in accordance with the applied direct-current voltage Vdc. As the applied rule used in this correction, an applied rule I of multiplying the capacitance value of the capacitive element $C_2$ by the capacitance change ratio Kc is used. In this case, the dimensionless coefficient is set for the capacitance change ratio Kc.

The characteristics of all the circuit elements constituting the capacitive circuit at the element positions 4 to 8 are changed by the application of the direct-current voltage Vdc, and the changes arise from the material of the dielectric. Accordingly, in the capacitive circuit, it is necessary to correct the characteristics of all the resistive elements $R_4$ to $R_8$ and the capacitive elements $C_4$ to $C_8$ in accordance with the applied direct-current voltage Vdc.

As the applied rule for the dimensionless coefficient in the correction of the capacitive elements $C_4$ to $C_8$, an applied rule II of multiplying the capacitance values of the capacitive elements $C_4$ to $C_8$ by the capacitance change ratio Kc and dividing by the dielectric-loss change ratio Kd is used. In this case, the dimensionless coefficient is set for the value obtained by dividing the capacitance change ratio Kc by the dielectric-loss change ratio Kd. As the applied rule for the dimensionless coefficient in the correction of the resistive elements $R_4$ to $R_8$, an applied rule III of multiplying the resistance values of the resistive elements $R_4$ to $R_8$ by the dielectric-loss change ratio Kd and dividing by the capacitance change ratio Kc is used. In this case, the dimensionless coefficient is set for the value obtained by dividing the dielectric-loss change ratio Kd by the capacitance change ratio Kc.

Among the circuit elements in the sub resonant circuit A at the element positions 9 and 10, the capacitive elements $C_9$ and $C_{10}$ are elements whose characteristics are changed by the application of the direct-current voltage Vdc, the changes arising from the material of the dielectric. Accordingly, in the sub resonant circuit A, it is necessary to correct the characteristics of the capacitive elements $C_9$ and $C_{10}$ in accordance with the applied direct-current voltage Vdc. As the applied rule for the dimensionless coefficient in this correction, an applied rule IV of multiplying the capacitance values of the capacitive elements $C_9$ and $C_{10}$ by the capacitance change ratio Kc is used. In this case, the dimensionless coefficient is set for the capacitance change ratio Kc.

In the circuit elements included in the inductive circuit at the element positions 11 to 13, there are no changes in characteristics arising from the material of the dielectric. Accordingly, in the inductive circuit, it is not necessary to correct the characteristics in accordance with the applied direct-current voltage Vdc. In the circuit elements included in the sub resonant circuit B at the element positions 14 and 15, there are no changes in characteristics arising from the material of the dielectric. Accordingly, in the sub resonant circuit B, it is not necessary to correct the characteristics in accordance with the applied direct-current voltage Vdc.

The equivalent series capacitance ESC of the capacitor is calculated from the following expression (15) using actually measured values, and the dielectric loss tan δ is calculated from the following expression (16) using actually measured values. Here, Im(Z) indicates the imaginary part of the impedance Z, and Re(Z) indicates the real part of the impedance Z of the capacitor.

(Math. 1)

$$ESC = -\frac{1}{\omega \text{Im}(Z)} = \frac{1}{\omega\sqrt{(Mag\ Z)^2 - (ESR)^2}} \quad (15)$$

(Math. 2)

$$\tan\delta = -\frac{\text{Re}(Z)}{\text{Im}(Z)} = \frac{ESR}{\sqrt{(Mag\ Z)^2 - (ESR)^2}} \quad (16)$$

Table 2 provided below shows the equivalent series capacitance C (μF) of the capacitor and the dielectric loss tan δ (%) obtained by the above calculation and the capacitance change ratio Kc (–) and dielectric-loss change ratio Kd (–) with respect to the characteristic values thereof when no direct-current voltage is applied. The capacitance change ratio Kc and dielectric-loss change ratio Kd are dimensionless quantities, and (–) indicates that they are dimensionless.

TABLE 2

| DC Bias Voltage (V) | Capacitance C (μF) | Change ratio Kc(—) | Dielectric Loss tanδ(%) | Change ratio Kd(—) |
|---|---|---|---|---|
| 0 | 8.212 | 1 | 0.733 | 1 |
| 0.5 | 8.323 | 1.013 | 0.870 | 1.186 |
| 1 | 8.137 | 0.991 | 0.857 | 1.168 |
| 1.5 | 7.813 | 0.951 | 0.837 | 1.141 |
| 2 | 7.395 | 0.901 | 0.810 | 1.105 |
| 2.5 | 6.926 | 0.843 | 0.773 | 1.055 |
| 3.15 | 6.297 | 0.767 | 0.737 | 1.005 |
| 4 | 5.503 | 0.670 | 0.693 | 0.945 |
| 5 | 4.670 | 0.569 | 0.647 | 0.882 |
| 6.3 | 3.781 | 0.460 | 0.603 | 0.823 |

FIG. 13(a) is a graph that represents the capacitance change ratio kc in the capacitor shown in the above table 2 as an approximate function of the direct-current voltage Vdc applied to the capacitor. FIG. 13(b) is a graph that represents the dielectric-loss change ratio Kd in the capacitor shown in the above table 2 as an approximate function of the direct-current voltage Vdc applied to the capacitor.

The horizontal axis in each of the graphs indicates the applied direct-current voltage (DC bias voltage) (V). The vertical axis in the graph of FIG. 13(a) indicates the capacitance change ratio Kc (–), and the vertical axis in the graph of FIG. 13(b) indicates the dielectric-loss change ratio Kd (–). The approximate function of the capacitance change ratio Kc is indicated by a characteristic line H1. The approximate function of the dielectric-loss change ratio Kd is indicated by a characteristic line H2. Plots p of square marks indicate measured values of the capacitance change ratio Kc and dielectric-loss change ratio Kd in Table 2. The characteristic lines H1 and H2 connecting the plots p are derived on the basis of these measured values, are expressed as the exponential function exp(f(x)) in the present embodiment, as described above, and are represented as an even function in the form of a polynomial expression that includes no odd number exponents.

Because the capacitance change ratio Kc and dielectric-loss change ratio Kd are expressed as approximate functions described above, the capacitance change ratio Kc and dielectric-loss change ratio Kd between the discrete measured values as shown in Table 2 for any continuous direct-current voltage Vdc can be complemented, and the dimensionless coefficient can be determined for any continuous direct-current voltage Vdc. Accordingly, multiplying the characteristic values of the resistive element R and capacitive element C by the dimensionless coefficient determined in this manner under the applied rules as described above and calculating the characteristic change ratios $k_{R1}$(Vdc) and $k_{C1}$(Vdc) enables derivation of the equivalent circuit model for any continuous direct-current voltage Vdc and calculation of circuit characteristics by causing the difference currents $\Delta I_{RX}$ (Vref), $\Delta I_{CX}$ (Vref), and $\Delta I_{LX}$(Vref) to flow concurrently using the derived equivalent circuit model in the present embodiment.

Figure 14:
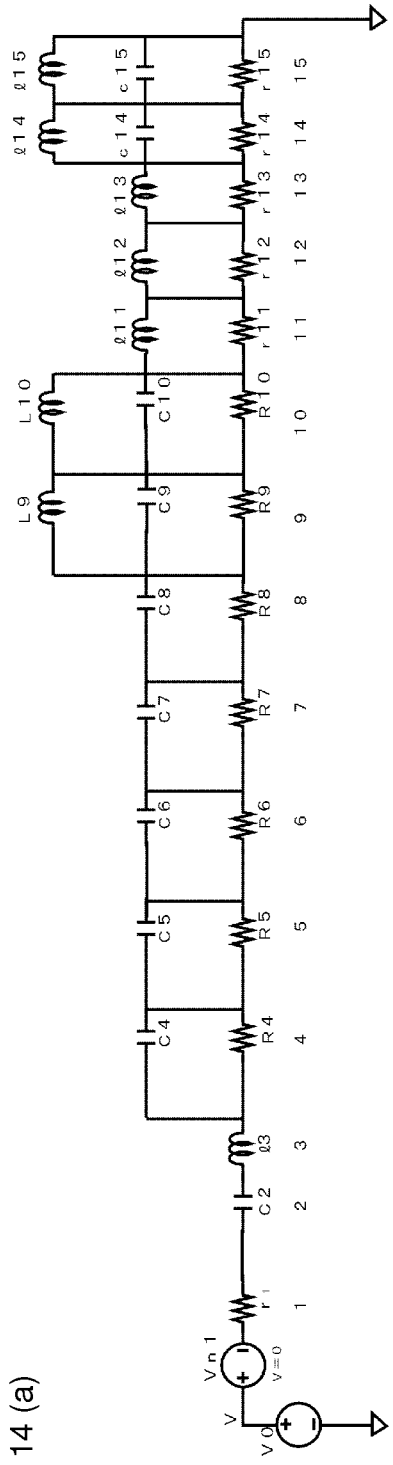
FIG. 14(a) is a circuit diagram that illustrates a capacitor passive equivalent circuit model when no direct-current voltage is applied based on the equivalent circuit model illustrated in FIG. 10 in the fourth embodiment and FIG. 14(b) is a circuit diagram that illustrates a capacitor nonlinear equivalent circuit model when direct-current voltage is applied in the fourth embodiment based on the same equivalent circuit model illustrated in FIG. 10.
Figure 14:
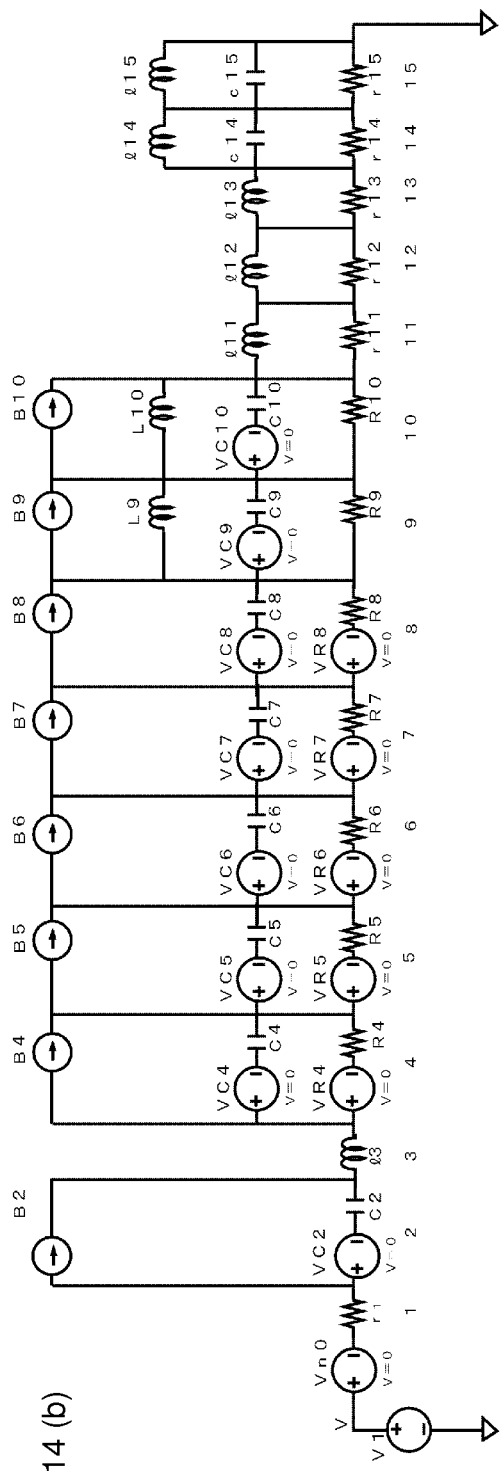

FIG. 14(a) is a circuit diagram that illustrates a capacitor passive equivalent circuit model when no direct-current voltage is applied based on the equivalent circuit model illustrated in FIG. 10 in the fourth embodiment. FIG. 14(b) is a circuit diagram that illustrates a capacitor nonlinear equivalent circuit model when direct-current voltage is applied in the fourth embodiment based on the same equivalent circuit model illustrated in FIG. 10. In FIG. 14, the portions identical with or corresponding to those in FIGS. 4 and 10 have the same reference numerals, and the description thereof is omitted.

In the passive equivalent circuit model illustrated in FIG. 14(a) in the fourth embodiment, the control current sources $B_X$, which are illustrated in FIG. 10, are removed. In the nonlinear equivalent circuit model illustrated in FIG. 14(b), voltage source models $V_{RX}$, $V_{CX}$, and $V_{LX}$ configured to measure currents flowing in the resistive element $R_X$, capacitive element $C_X$, and inductive element Lx are disposed as ammeters. In the equivalent circuit models in the fourth embodiment, the plurality of parallel circuits of the control current sources $B_X$ and the passive circuit elements $R_X$, $C_X$, and $L_X$ are connected in series, as in the equivalent circuit models in the second embodiment illustrated in FIG. 4. The equivalent circuit models in the present embodiment also include the passive circuit elements $r_X$, $c_X$, and $l_X$, whose characteristics are not changed by the application of the direct-current voltage Vdc to the capacitor, as in the equivalent circuit model in the third embodiment illustrated in FIG. 9.

In the fourth embodiment, in the passive equivalent circuit model illustrated in FIG. 14(a), the alternating-current voltage Vac in which the direct-current voltage Vdc is not applied is applied to the circuit as the voltage V by the voltage source model $V_0$. In the nonlinear equivalent circuit model illustrated in FIG. 14(b), the alternating-current voltage Vac in which the direct-current voltage Vdc is applied is applied, to the circuit as the voltage V by the voltage source model $V_1$.

In simulation of the capacitor using the equivalent circuit models illustrated in FIG. 14, first, the characteristic change ratios $k_{RX}$(Vdc), $k_{CX}$(Vdc), and $k_{LX}$(Vdc) of the passive circuit elements $R_X$, $C_X$, and $L_X$ corresponding to the reference voltage Vref are calculated using the approximate function exp(f(x)) representing the characteristic line H1 illustrated in FIG. 13(a). The control current sources $B_X$ generate the difference currents $\Delta I_{RX}$(Vdc), $\Delta I_{CX}$(Vdc), and $\Delta I_{LX}$(Vdc) between the currents $I_{RX}$ (Vdc), $I_{CX}$ (Vdc), and $I_{LX}$(Vdc) when direct-current voltage is applied and the currents $I_{RX}$, $I_{CX}$, and $I_{LX}$ flowing when no direct-current voltage is applied by the same simulation method as in the first embodiment on the basis of the calculated characteristic change ratios $k_{RX}$(Vdc), $k_{CX}$(Vdc), and $k_{LX}$(Vdc) and the currents $I_{RX}$, $I_{CX}$, and $I_{LX}$ flowing when no direct-current voltage is applied.

FIG. 15(a) is a graph that represents calculated values of magnitude MagZ of capacitor impedance Z obtained using the equivalent circuit model illustrated in FIG. 14 in comparison with measured values when the direct-current voltage Vdc of a rated voltage of 6.3 V is applied. The horizontal axis in the graph indicates the frequency (Hz), and the vertical axis indicates the value ($\Omega$) of magnitude MagZ. The measured values of the magnitude MagZ when the applied direct-current voltage Vdc is 0 V are represented by a characteristic line E0, which is indicated by the solid line. The measured values of the magnitude MagZ when the applied direct-current voltage Vdc is 6.3 V are represented by a characteristic line E1, which is indicated by the solid line. The calculated values of the magnitude MagZ when the applied direct-current voltage Vdc is 6.3 V are represented by a characteristic line E2, which is indicated by the broken line.

FIG. 15(b) is a graph that represents calculated values of capacitor equivalent series resistance ESR obtained using the equivalent circuit model illustrated in FIG. 14 in comparison with measured values when the same direct-current voltage Vdc of a rated voltage of 6.3 V is applied. The horizontal axis in this graph indicates the frequency (Hz), and the vertical axis indicates the value ($\Omega$) of the equivalent series resistance ESR. The measured values of the equivalent series resistance ESR when the applied direct-current voltage Vdc is 0 V are represented by a characteristic line F0, which is indicated by the solid line. The measured values of the equivalent series resistance ESR when the applied direct-current voltage Vdc is 6.3 V are represented by a characteristic line F1, which is indicated by the solid line. The calculated values of the equivalent series resistance ESR when the applied direct-current voltage Vdc is 6.3 V are represented by a characteristic line F2, which is indicated by the broken line.

Figure 15:
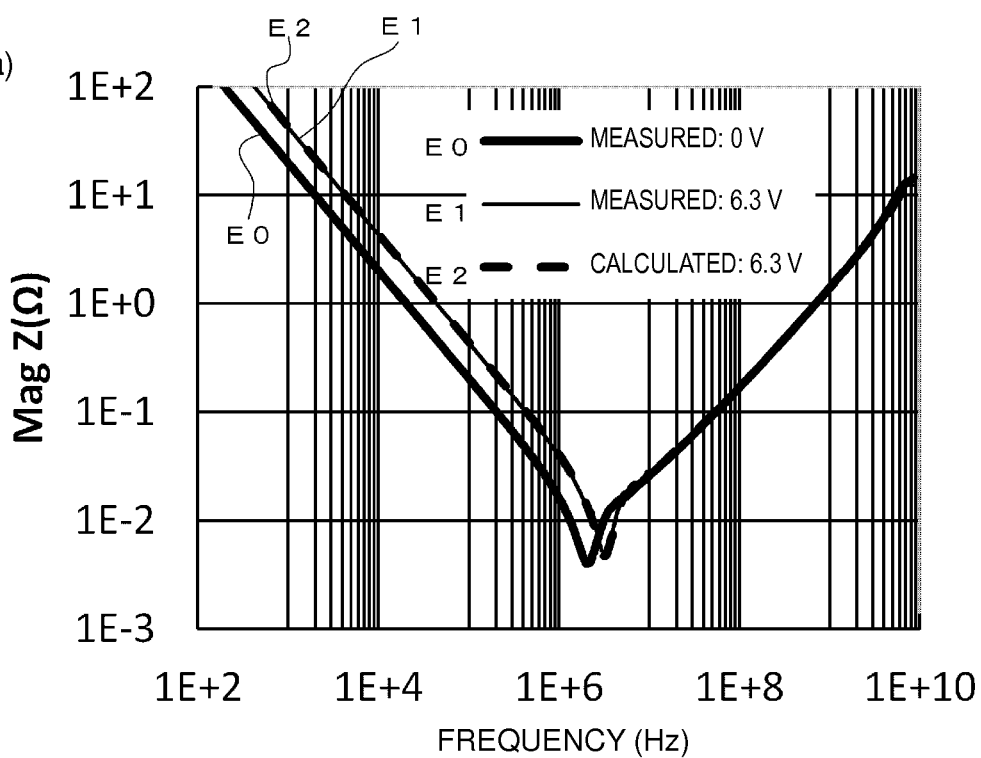
FIG. 15(a) is a graph that represents calculated values of magnitude MagZ of capacitor impedance Z obtained using the equivalent circuit model illustrated in FIG. 14 in comparison with measured values and FIG. 15(b) is a graph that represents calculated values of capacitor equivalent series resistance ESR obtained using the equivalent circuit model illustrated in FIG. 14 in comparison with measured values.
Figure 15:
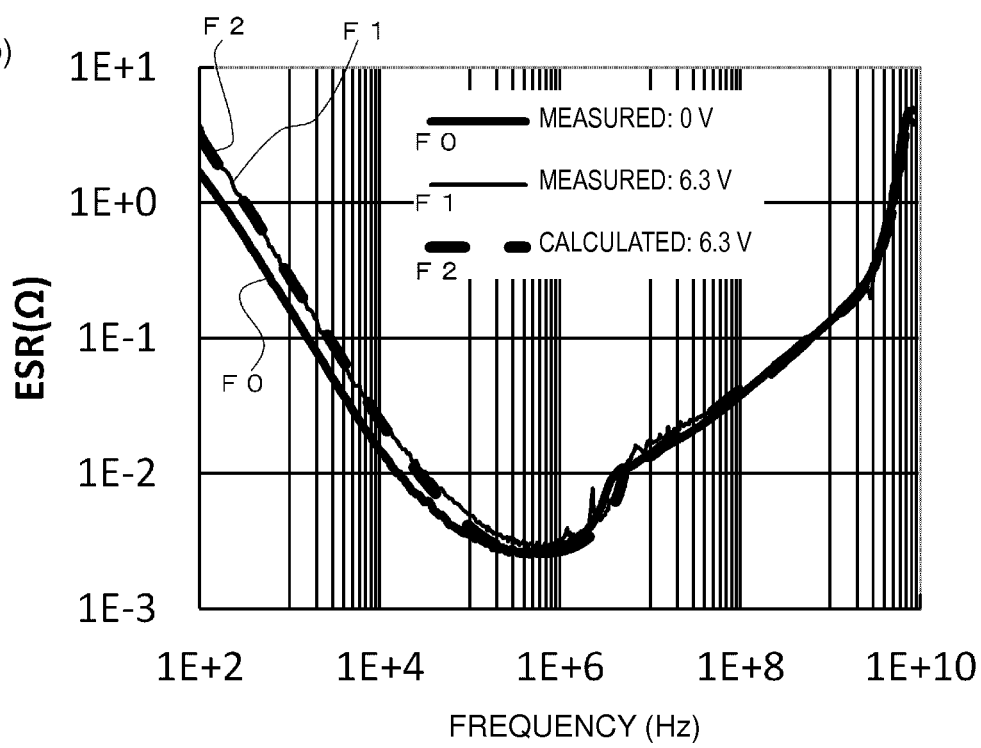

The graphs in FIG. 15 show that the calculated values of both the magnitude MagZ of impedance Z and the equivalent series resistance ESR when the direct-current voltage Vdc is applied satisfactorily match with the measured values over the range of 100 Hz to 8.5 GHz.

That is, with the simulation using the capacitor equivalent circuit models illustrated in FIG. 14 in the fourth embodiment, the characteristics of the capacitor varying in accordance with the applied direct-current voltage Vdc can be reproduced and simulated in a wide range and with high precision. Thus, substantially the same operational advantages as in the first to third embodiments are also obtainable.

In the above-described embodiments, the cases where the equivalent circuit models are applied to LTspice supplied from Linear Technology Corporation are described. Circuit simulators to which the equivalent circuit models are applicable are not limited to LTspice. For example, they are also applicable to other circuit simulators, such as Microwave Office supplied from Applied Wave Research Corporation (AWR Corporation) and ADS supplied from Agilent Technologies Inc. Corporation (Agilent Corporation).

INDUSTRIAL APPLICABILITY

The capacitor simulation method and capacitor nonlinear equivalent circuit model in the above-described embodiments can be easily used by employing a computer program described below. The computer program includes first, second, and third steps. In the first step, the type of a capacitor used in electronic circuit design is input. In the second step, a voltage V to be applied to the capacitor or a current I to be flowed to the capacitor is input. In the third step, the voltage V applied to the capacitor is measured using the voltage V or the current I input in the second step, and a reference voltage Vref is referred to. Then, control current sources $B_X$ generate difference currents $\Delta I_{RX}$ (Vref), $\Delta I_{CX}$ (Vref), and $\Delta I_{LX}$(Vref) in accordance with the reference voltage Vref on the basis of characteristic change ratios $k_{RX}$(Vref), $k_{CX}$(Vref), and $k_{LX}$(Vref) calculated in accordance with the reference voltage Vref using an approximate function exp(f (x)) prepared in advance for the capacitor of the type input in the first step and currents $I_{RX}$, $I_{CX}$, and $I_{LX}$ flowing when no direct-current voltage is applied, they are caused to flow concurrently with the currents $I_{RX}$, $I_{CX}$, and $I_{LX}$ flowing when no direct-current voltage is applied, and thus the nonlinear characteristics of the capacitor when direct current is applied are simulated. The computer program implements the capacitor simulation method in the above-described embodiments or causes the capacitor nonlinear equivalent circuit model in the above-described embodiments to function by computation processing of performing the above steps.

With the present configuration, inputting the type of the capacitor to be simulated and the values of the voltage V to be applied to the capacitor or the current I to be flowed to the capacitor into the computer program enables the computer program to cause the difference currents $\Delta I_{RX}$ (Vref), $\Delta I_{CX}$ (Vref), and $\Delta I_{LX}$(Vref) to flow concurrently with the currents $I_{RX}$, $I_{CX}$, and $I_{LX}$ flowing when no direct-current voltage is applied of the passive circuit elements Rx, Cx, and Lx and to automatically perform simulation of the nonlinear characteristics of the capacitor of the input type. Thus, a user can perform accurate circuit simulation with high precision easily by simply inputting the type of the capacitor to be simulated and the voltage V to be applied to the capacitor or the current I to be flowed to the capacitor into the computer program. As a result, even an ordinary user who does not have expert knowledge of circuit simulation can perform accurate circuit simulation for electronic circuits using the capacitor with high precision easily.

The above-described computer program can be used from a terminal, such as a personal computer, connected to the Internet network by accessing a server of an electronic component manufacturer having the above-described computer program over the Internet network. With the present configuration, a user can readily use the above-described computer program by accessing a server having the above-described computer program from a terminal connected to the Internet network. Thus, the capacitor simulation method and capacitor nonlinear equivalent circuit model in the above-described embodiments can be provided to many users.

The invention claimed is:

1. A capacitor simulation method for simulating nonlinear characteristics of a capacitor, comprising:
representing an equivalent circuit of the capacitor by using a passive circuit element;
expressing a characteristic change ratio of the passive circuit element when a direct-current voltage is applied as an approximate function that uses the voltage as a variable, based on actually measured values; and
referring to a voltage across the capacitor, generating, using a computer, a difference current between a current flowing in the passive circuit element when the direct-current voltage is applied and a current flowing in the passive circuit element when no direct-current voltage is applied, based on the characteristic change ratio calculated using the approximate function in accordance with the referred voltage and based on a current flowing in the passive circuit element when no direct-current voltage is applied, by using a control current source connected in parallel to the passive circuit element whose characteristics are changed by application of the direct-current voltage, and applying the difference current on the current flowing in the passive circuit element when no direct-current voltage is applied, thereby simulating the nonlinear characteristics of the capacitor when the direct-current voltage is applied.

2. A computer program product, comprising:
a non-transitory computer-readable memory that includes a capacitor nonlinear equivalent circuit model program that, when accessed by a computer, causes the computer to:
represent, using a passive circuit element, an equivalent circuit of a capacitor;
refer to, using a voltage referring device, a voltage across the capacitor;
generate, using a control current source, a difference current between a current flowing in the passive circuit element when a direct-current voltage is applied and a current flowing in the passive circuit element when no direct-current voltage is applied, based on a characteristic change ratio of the passive circuit element when the direct-current voltage is applied, which is calculated in accordance with the voltage referred to by the voltage referring device and by using an approximate function expressed with a voltage as a variable, from actually measured values, and on the current flowing in the passive circuit element when no direct-current voltage is applied, the control current source being connected in parallel to the passive circuit element whose characteristics are changed by application of a direct-current voltage; and
apply the difference current on the current flowing in the passive circuit element when no direct-current voltage is applied, thereby simulating the nonlinear characteristics of the capacitor when the direct-current voltage is applied.

3. The capacitor simulation method of claim 1, wherein the difference current is given as a function form of the following expression:

$$\Delta I = I0 \times [\exp(f(x)) - 1]$$

where the difference current is $\Delta I$, the current under no direct-current voltage applied is I0, and the approximate function is the function $\exp(f(x))$ using the referred voltage x as a variable.

4. The capacitor simulation method of claim 1, wherein the approximate function is given by an even function in a polynomial form that includes no odd number exponents.

5. The capacitor simulation method of claim 1, wherein the voltage across the capacitor is referred to at both terminals of the equivalent circuit, and the current flowing when no direct-current voltage is applied is referred to at an input terminal or at an output terminal of the passive circuit elements.

6. The capacitor simulation method of claim 1, wherein the passive circuit element connected in parallel to the control current source is a single capacitive element, or a parallel circuit of a capacitive element and a resistive element, or a parallel circuit of a capacitive element, a resistive element, and an inductive element.

7. The capacitor simulation method of claim 1, wherein a plurality of parallel circuits, each constituted by the control current source and the passive circuit element, form a series circuit.

8. The capacitor simulation method of claim 1, wherein the equivalent circuit includes a passive circuit element whose characteristics are not changed by application of a direct-current voltage.

9. A capacitor simulation method for simulating nonlinear characteristics of a capacitor under application of a direct-current voltage, comprising: using the capacitor nonlinear equivalent circuit model of claim 2.

10. A non-transitory computer-readable memory that includes a computer program for implementing the capacitor simulation method of claim 1, the computer program comprising: a first step of inputting, using a computer, a type of the capacitor; a second step of inputting, using the computer, a voltage to be applied to the capacitor or a current to be flowed to the capacitor; and a third step of using the computer, referring to the voltage across the capacitor in accordance with the voltage or the current input in the second step, generating the difference current by the control current source based on the characteristic change ratio calculated using the approximate function prepared in advance for the capacitor of the type input in the first step in accordance with the referred voltage and the current flowing in the passive circuit element when no direct-current voltage is applied, applying the difference current on the current flowing in the passive circuit element when no direct-current voltage is applied, thereby simulating the nonlinear characteristics of the capacitor when the direct-current voltage is applied.

11. A method of using the computer program of claim 10 by accessing a server having the computer program over the Internet network and using the computer program from a terminal connected to the Internet network.

12. The computer program product of claim 2, wherein the difference current is given as a function form of the following expression:

$$\Delta I = I0 \times [\exp(f(x)) - 1]$$

where the difference current is $\Delta I$, the current under no direct-current voltage applied is I0, and the approximate function is the function $\exp(f(x))$ using the referred voltage x as a variable.

13. The computer program product of claim 2, wherein the approximate function is given by an even function in a polynomial form that includes no odd number exponents.

14. The computer program product of claim 2, wherein the voltage across the capacitor is referred to at both terminals of the equivalent circuit, and the current flowing when no direct-current voltage is applied is referred to at an input terminal or at an output terminal of the passive circuit elements.

15. The computer program product of claim 2, wherein the passive circuit element connected in parallel to the control current source is a single capacitive element, or a parallel circuit of a capacitive element and a resistive element, or a parallel circuit of a capacitive element, a resistive element, and an inductive element.

16. The computer program product of claim 2, wherein a plurality of parallel circuits, each constituted by the control current source and the passive circuit element, form a series circuit.

17. The computer program product of claim 2, wherein the equivalent circuit includes a passive circuit element whose characteristics are not changed by application of a direct-current voltage.

18. The computer program product of claim 2, further comprising: a non-transitory computer-readable memory containing a computer program for enabling the capacitor nonlinear equivalent circuit model program of claim 2 that, when accessed by a computer, causes the computer to perform: a first step of inputting a type of the capacitor; a second step of inputting a voltage to be applied to the capacitor or a current to be flowed to the capacitor; and a third step of referring to the voltage across the capacitor in accordance with the voltage or the current input in the second step, generating the difference current by the control current source based on the characteristic change ratio calculated using the approximate function prepared in advance for the capacitor of the type input in the first step in accordance with the referred voltage and the current flowing in the passive circuit element when no direct-current voltage is applied, applying the difference current to the current flowing in the passive circuit element when no direct-current voltage is applied, thereby simulating the nonlinear characteristics of the capacitor when the direct-current voltage is applied.

\* \* \* \* \*